(12) United States Patent
Diorio et al.

(10) Patent No.: US 7,405,660 B2
(45) Date of Patent: Jul. 29, 2008

(54) ERROR RECOVERY IN RFID READER SYSTEMS

(75) Inventors: Christopher J. Diorio, Seattle, WA (US); Seth W. Bridges, Seattle, WA (US); Aanand Esterberg, Seattle, WA (US); William T. Colleran, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 360 days.

(21) Appl. No.: 11/388,235

(22) Filed: Mar. 22, 2006

(65) Prior Publication Data

US 2006/0236203 A1 Oct. 19, 2006

Related U.S. Application Data

(60) Provisional application No. 60/665,152, filed on Mar. 24, 2005, provisional application No. 60/763,843, filed on Jan. 30, 2006.

(51) Int. Cl.
*G08B 13/14* (2006.01)

(52) U.S. Cl. ............... 340/572.4; 340/572.1; 340/10.1; 340/10.3

(58) Field of Classification Search ........... 340/572.4, 340/10.51, 572.1, 5.65, 10.1, 10.3, 10.4, 340/572.2, 10.5, 825.69, 825.72; 714/2, 714/15, 801, 804; 702/107; 331/175; 342/118, 342/147

See application file for complete search history.

(56) References Cited

U.S. PATENT DOCUMENTS

| 4,691,202 A | 9/1987 | Denne et al. ............ 340/825.54 |
|---|---|---|
| 4,783,783 A | 11/1988 | Nagai et al. ................. 371/12 |
| 4,935,702 A | 6/1990 | Mead et al. ..................... 330/9 |
| 5,347,280 A | 9/1994 | Schuermann ................. 342/42 |
| 5,537,105 A | 7/1996 | Marsh et al. ........... 340/825.54 |
| 5,742,618 A | 4/1998 | Lowe .......................... 371/36 |
| 5,805,632 A | 9/1998 | Leger .......................... 375/122 |
| 5,818,348 A | 10/1998 | Walczak et al. ........ 340/825.54 |

(Continued)

FOREIGN PATENT DOCUMENTS

EP 0 298 618 A3 1/1989

(Continued)

OTHER PUBLICATIONS

Carley, L.R., "Trimming Analog Circuits Using Floating-Gate Analog MOS Memory", IEEE Journal of Solid-State Circuits, vol. 24, No. 6, Dec. 1989. pp. 1569-1575.

(Continued)

*Primary Examiner*—Toan Pham
(74) *Attorney, Agent, or Firm*—Dorsey & Whitney LLP

(57) ABSTRACT

RFID systems, devices, software and methods are adapted for receiving from an RFID tag at least waves that communicate at least a first version of its code. An output tag code is output that is the same as the first version, if a fidelity criterion is met regarding the first version. If not met, the output tag code is instead a final version that is reconstructed from the first version, and also from any additionally optionally subsequently received versions. In some embodiments, an error recovery block includes a subcomponent fidelity criterion checking block that can determine whether the fidelity criterion is met, and a code reconstruction block that can derive the final version.

79 Claims, 18 Drawing Sheets

U.S. PATENT DOCUMENTS

| | | | |
|---|---|---|---|
| 5,929,779 A | 7/1999 | MacLellan et al. | 340/825.54 |
| 5,933,039 A | 8/1999 | Hui et al. | 327/262 |
| 5,939,945 A | 8/1999 | Thewes et al. | 330/277 |
| 5,940,006 A | 8/1999 | MacLellan et al. | 340/825.54 |
| 5,952,891 A | 9/1999 | Boudry | 331/57 |
| 5,952,922 A | 9/1999 | Shober | 340/572.4 |
| 5,986,570 A | 11/1999 | Black et al. | 340/825.54 |
| 6,130,632 A | 10/2000 | Opris | 341/120 |
| 6,134,182 A | 10/2000 | Pilo et al. | 365/233 |
| 6,169,485 B1* | 1/2001 | Campana, Jr. | 340/573.4 |
| 6,208,235 B1 | 3/2001 | Trontelj | 340/10.1 |
| 6,266,362 B1 | 7/2001 | Tuttle et al. | 375/141 |
| 6,320,788 B1 | 11/2001 | Sansbury et al. | 365/185.1 |
| 6,353,406 B1 | 3/2002 | Lanzl et al. | 342/118 |
| 6,357,025 B1 | 3/2002 | Tuttle | 714/724 |
| 6,483,427 B1 | 11/2002 | Werb | 340/10.1 |
| 6,587,457 B1 | 7/2003 | Mikkonen | 370/356 |
| 6,691,273 B2 | 2/2004 | Wagner et al. | 714/751 |
| 6,801,833 B2 | 10/2004 | Pintsov et al. | 700/223 |
| 6,812,824 B1 | 11/2004 | Goldinger et al. | 340/10.1 |
| 6,958,678 B2* | 10/2005 | Hohberger et al. | 340/10.1 |
| 7,103,019 B1* | 9/2006 | Moon | 370/328 |
| 7,327,218 B2* | 2/2008 | Hohberger et al. | 340/10.1 |
| 2001/0010491 A1 | 8/2001 | Marneweck et al. | 340/10.33 |
| 2001/0020861 A1 | 9/2001 | Hirose | 327/284 |
| 2001/0054920 A1 | 12/2001 | Tsujino | 327/141 |
| 2002/0049910 A1 | 4/2002 | Salomon et al. | 713/193 |
| 2002/0167405 A1 | 11/2002 | Shanks et al. | 340/572.1 |
| 2003/0163287 A1 | 8/2003 | Vock et al. | 702/187 |
| 2003/0177429 A1 | 9/2003 | Hessel et al. | 714/751 |
| 2003/0234718 A1 | 12/2003 | Fujisawa et al. | 340/5.1 |
| 2004/0090310 A1 | 5/2004 | Hohberger et al. | 340/10.1 |
| 2004/0257203 A1 | 12/2004 | Maltsev et al. | 340/10.1 |
| 2005/0104790 A1 | 5/2005 | Duron | 343/745 |
| 2005/0225435 A1 | 10/2005 | Diorio et al. | 340/10.5 |
| 2006/0068701 A1 | 3/2006 | Chapman et al. | 455/41.1 |
| 2006/0143318 A1 | 6/2006 | Prajapat et al. | 710/8 |
| 2006/0152364 A1 | 7/2006 | Walton | 340/568.1 |
| 2006/0181393 A1 | 8/2006 | Raphaeli | 340/10.1 |
| 2006/0261952 A1* | 11/2006 | Kavounas et al. | 340/572.2 |

FOREIGN PATENT DOCUMENTS

| | | |
|---|---|---|
| EP | 0 681 192 A3 | 7/1996 |
| EP | 0 696 852 A3 | 7/1997 |
| EP | 0 715 417 A3 | 7/1997 |
| EP | 0 935 211 A2 | 8/1999 |
| EP | 0 939 496 A1 | 9/1999 |
| JP | 11-120305 | 4/1999 |
| WO | WO 01/73854 A3 | 10/2001 |

OTHER PUBLICATIONS

Jonietz, E., "Tracking Privacy", Technology Review, An MIT Enterprise, Jul. 10, 2004. Three pages.

Low, A. et al., "Basics of Floating-Gate Low-Dropout Voltage Regulators", IEEE Midwest Symposium on Circuits and Systems, Lansing, Michigan, Aug. 8-11, 2000. pp. 1048-1051.

Raszka, J. et al., "Embedded Flash Memory for Security Applications in a 0.13μm CMOS Logic Process", IEEE International Solid-State Circuits Conference, 2004. Ten pages.

Weis, S.A., et al., "Security and Privacy Aspects of Low-Cost Radio Frequency Identification Systems", Laboratory for Computer Sciences, Auto-ID Center, Massachusetts Institute of Technology, 2003. pp. 1-12.

Yoshida, J., "RFID 'kill' feature aims to sooth privacy fears", CommsDesign, http://www.commsdesign.com/showArticle.jhtml?articleID=16500813, Apr. 28, 2003. Four pages.

EPCGLOBAL, Inc. "Specification for RFID Air Interface-EPC Radio-Frequency Identity Protocols Class-1 Generation-2 UHF RFID Protocol for Communications at 860 MHz-960 MHz, Version 1.1.0." (a.k.a. "The Gen 2 Spec".) EPCglobal Inc., Dec. 17, 2005. <http://www.epcglobalinc.org>.

EPCGLOBAL Inc. "Specification for RFID Air Interface-EPC Radio-Frequency Identity Protocols Class-1 Generation-2 UHF RFID Protocol for Communications at 860 MHz-960 MHz, Version 1.0.8." EPCglobal Inc., Dec. 14, 2004. <http://www.epcglobalinc.org>.

Declaration of Stacy L. Jones authenticating attached Website Materials as accessed and posted at http://www.autoid.org/SC31/sc_31_wg4_sg3.htm on Sep. 1, 2006.

* cited by examiner

*RFID READER SYSTEM CONFIGURATION WITH OPTIONAL LOCAL AND REMOTE COMPONENTS*

*READER SYSTEM COMPONENTS
WITH ERROR RECOVERY*

SUBCOMPONENTS FOR ERROR RECOVERY BLOCK

*ERROR RECOVERY METHOD FOR CODE RECEIVED FROM TAG*

*POSSIBLE FIDELITY CRITERION / GUIDING IDENTIFICATION OF SUSPECT SAMPLE(S)*

GUIDING IDENTIFICATION OF SUSPECT SAMPLE(S)

RECONSTRUCTION

AVERAGING SAMPLED DATA VALUES
TO OVERCOME DETECTION ERRORS

*ERROR RECOVERY METHOD*

ERROR RECOVERY IN RFID READER SYSTEMS

CROSS REFERENCE TO RELATED PATENT APPLICATIONS

This patent application claims priority from U.S.A. Provisional Patent Application No. 60/665,152 filed on 2005, Mar. 24, the disclosure of which is hereby incorporated by reference for all purposes.

This patent application claims priority from U.S.A. Provisional Patent Application No. 60/763,843 filed on 2006Jan. 30, the disclosure of which is hereby incorporated by reference for all purposes.

TECHNICAL FIELD

The present description is related to the field of Radio Frequency Identification (RFID) systems, and more specifically to devices, systems, software and methods for RFID reader systems able to recover from errors in a received tag transmission by reconstructing a version of the received data.

BACKGROUND

Radio Frequency IDentification (RFID) systems typically include RFID tags and RFID readers (the latter are also known as RFID reader/writers or RFID interrogators). RFID systems can be used in many ways for locating and identifying objects to which the tags are attached. RFID systems are particularly useful in product-related and service-related industries for tracking large numbers of objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. A tag that senses the interrogating RF wave responds by transmitting back another RF wave. The tag generates the transmitted back RF wave either originally, or by reflecting back a portion of the interrogating RF wave in a process known as backscatter. Backscatter may take place in a number of ways.

The reflected-back RF wave may further encode data stored internally in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on.

An RFID tag typically includes an antenna system, a power management section, a radio section, and frequently a logical section, a memory, or both. In earlier RFID tags, the power management section included an energy storage device, such as a battery. RFID tags with an energy storage device are known as active tags. Advances in semiconductor technology have miniaturized the electronics so much that an RFID tag can be powered solely by the RF signal it receives. Such RFID tags do not include an energy storage device, and are called passive tags.

When reading RFID tags, a wireless wave is backscattered from the RFID tag. The tag transmits its code, such as an Electronic Product Code (EPC), by encoding data in the backscattered waveform.

In both types of transmissions, i.e. forward link of reader to tag and reverse link of tag backscatter, each waveform can be thought of as a group of ordered waveform segments that, for example, take values between a High (H) and a Low (L). In the forward link, the H is usually the waveform at its full amplitude, to be transmitting the maximum power to the tag, so that it can be powered maximally. The L is the amplitude at a value less than the maximum, which is called the "modulation depth." The modulation depth is an intermediate value; it should be deep enough for an L to be easily distinguishable from an H, but as long as it is not a real zero (100% modulation depth), it can continue powering the tag.

The wireless wave is received by an antenna of the reader to become a signal of the antenna. A demodulator extracts from the signal a waveform, made by waveform segments. These waveform segments are, ideally, received by the reader in the same way as the tag encoded them. Then they are decoded, to determine what the tag transmitted, namely its code.

For purposes of decoding, the waveform segments may be processed as analog signals. Or they may become numerical waveform values. Preferably, an Analog to Digital Converter (ADC) converts the electrical signal of each segment into one or more sampled digital values. If more than one value is provided, then the segment is considered divided into subsegments, and statistics can be used to extract a general value for each waveform segment, etc. These waveform values are compared to a threshold, to determine as to whether a waveform segment is an H or a L.

A problem is errors. Ideally, the reader system should receive exactly what the tag transmitted. But in reality, the wave received by the reader system could be distorted from the wave that is transmitted by the reader tag for various reasons (e.g. interference in the environment, such as from other readers, etc.).

For purposes of the present description, what is received from the tag is called a "version" of the tag code. "Version" is a general word, applying equally to either the received waveform, or its segments, or their values, or the tag code encoded in the segments and/or values, etc. The term "version" is used because, strictly speaking, while the tag is deemed to transmit its code exactly, what the reader receives could be different as per the above.

It is known that conventional reader systems detect that there is an error by adding a Cyclic Redundancy Check (CRC) to the version of the tag code that is being transmitted. The CRC is received along with the code, and an analysis informs whether there is an error in the overall transmission. If no error is detected, the received code version is deemed correct. If, however, an error is detected, the CRC does not inform which bit was wrong.

Accordingly, the only available prior art solution has been to discard what has been received, and start over, by asking for another version of the code, checking again, and so on. When a version is received for which the CRC does not inform that there is an error, that version is treated as the right one over all the others.

Receiving repeated versions takes more time, which slows down the throughput of an RFID reader system. Moreover, in the presence of heavy interference, more repetitions will be statistically needed, until an error free one arrives. Beyond some point, the system may even abandon the effort and start over.

BRIEF SUMMARY

The present description gives instances of RFID systems, devices, software and methods that improve over the prior art. In some embodiments, when a first version of a tag code is received, it is determined whether a fidelity criterion is met. If so, the first version is output.

Even if the fidelity criterion is not met, however, a final version of the code is reconstructed from at least the received version, and output instead of the first version. In some embodiments, reconstruction takes place without receiving a second version beyond the first. An advantage, therefore, is that the RFID reader system can operate faster in reading tags.

In a number of other embodiments, a second version of the code is received, and additionally used to reconstruct the final version. Even in those instances, however, it is not required that the correct version ever be received, either as the first version, or the second, or even higher. More robust reading of the tags thus results, even in the presence of interference.

These and other features and advantages of this description will become more readily apparent from the following Detailed Description, which proceeds with reference to the drawings, in which:

DETAILED DESCRIPTION

As has been mentioned, the present description is about devices, systems, software and methods for RFID reader systems capable of determining errors in a received tag transmission and reconstructing a version of the received data to compensate for such errors.

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention. The subject is now described in more detail.

Figure 1:
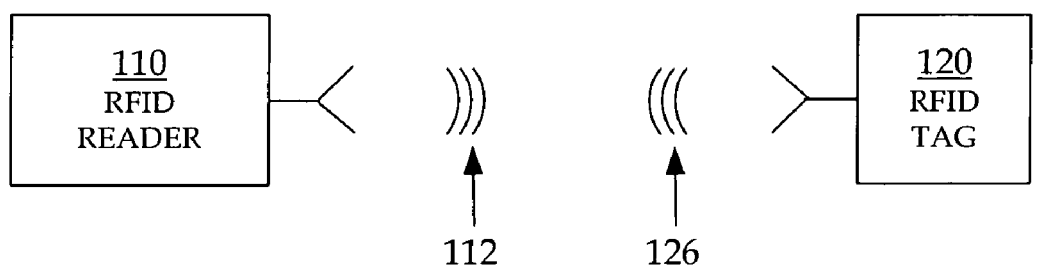
FIG. 1 is a block diagram of an RFID system according to embodiments.

FIG. 1 is a diagram of components of a typical RFID system 100, incorporating aspects of the invention. An RFID reader 110 transmits an interrogating Radio Frequency (RF) wave 112. RFID tag 120 in the vicinity of RFID reader 110 may sense interrogating RF wave 112, and generate wave 126 in response. RFID reader 110 senses and interprets wave 126.

Reader 110 and tag 120 exchange data via wave 112 and wave 126. In a session of such an exchange, each encodes, modulates, and transmits data to the other, and each receives, demodulates, and decodes data from the other. The data is modulated onto, and decoded from, RF waveforms.

Encoding the data in waveforms can be performed in a number of different ways. For example, protocols are devised to communicate in terms of symbols, also called RFID symbols. A symbol for communicating can be a delimiter, a calibration symbol, and so on. Further symbols can be implemented for ultimately exchanging binary data, such as "0" and "1", if that is desired.

Tag 120 can be a passive tag or an active tag, i.e. having its own power source. Where tag 120 is a passive tag, it is powered from wave 112.

The components of the RFID system of FIG. 1 may communicate with each other in any number of modes. One such mode is called full duplex. Another such mode is called half-duplex, and is described below.

Figure 2:
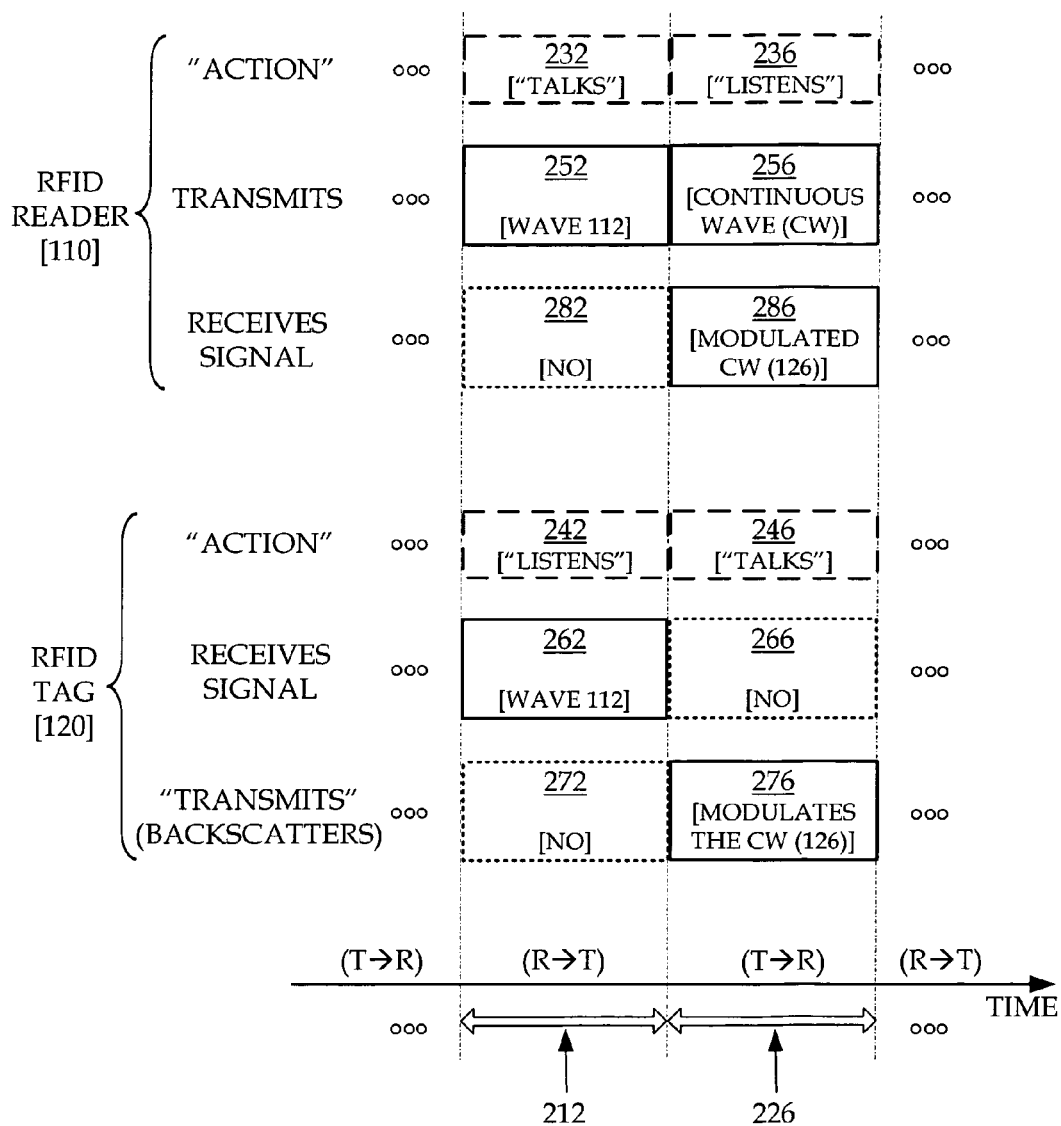
FIG. 2 is a conceptual diagram for explaining a half-duplex mode of communication between the components of the RFID system of FIG. 1.

FIG. 2 is a conceptual diagram 200 for explaining the half-duplex mode of communication between the components of the RFID system of FIG. 1. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 212, and a following sample T→R communication session occurs during a time interval 226. Of course intervals 212, 226 can be of different durations—here the durations are shown approximately equal only for purposes of illustration.

According to blocks 232 and 236, RFID reader 110 talks during interval 212, and listens during interval 226. According to blocks 242 and 246, RFID tag 120 listens while reader 110 talks (during interval 212), and talks while reader 110 listens (during interval 226).

In terms of actual technical behavior, during interval 212, reader 110 talks to tag 120 as follows. According to block 252, reader 110 transmits wave 112, which was first described in FIG. 1. At the same time, according to block 262, tag 120 receives wave 112 and processes it. Meanwhile, according to block 272, tag 120 does not backscatter with its antenna, and according to block 282, reader 110 has no wave to receive from tag 120.

During interval 226, tag 120 talks to reader 110 as follows. According to block 256, reader 110 transmits a Continuous Wave (CW), which can be thought of as a carrier signal that ideally encodes no information. As discussed before, this carrier signal serves both to be harvested by tag 120 for its own internal power needs, and also as a wave that tag 120 can backscatter. Indeed, during interval 226, according to block 266, tag 120 does not receive a signal for processing. Instead, according to block 276, tag 120 modulates the CW emitted according to block 256, so as to generate backscatter wave 126. Concurrently, according to block 286, reader 110 receives backscatter wave 126 and processes it.

The RFID reader system may be configured to include a number of optional local and remote components to facilitate the communication with RFID tag illustrated in FIG. 2. The RFID reader system as a whole is described generally below.

Figure 3:
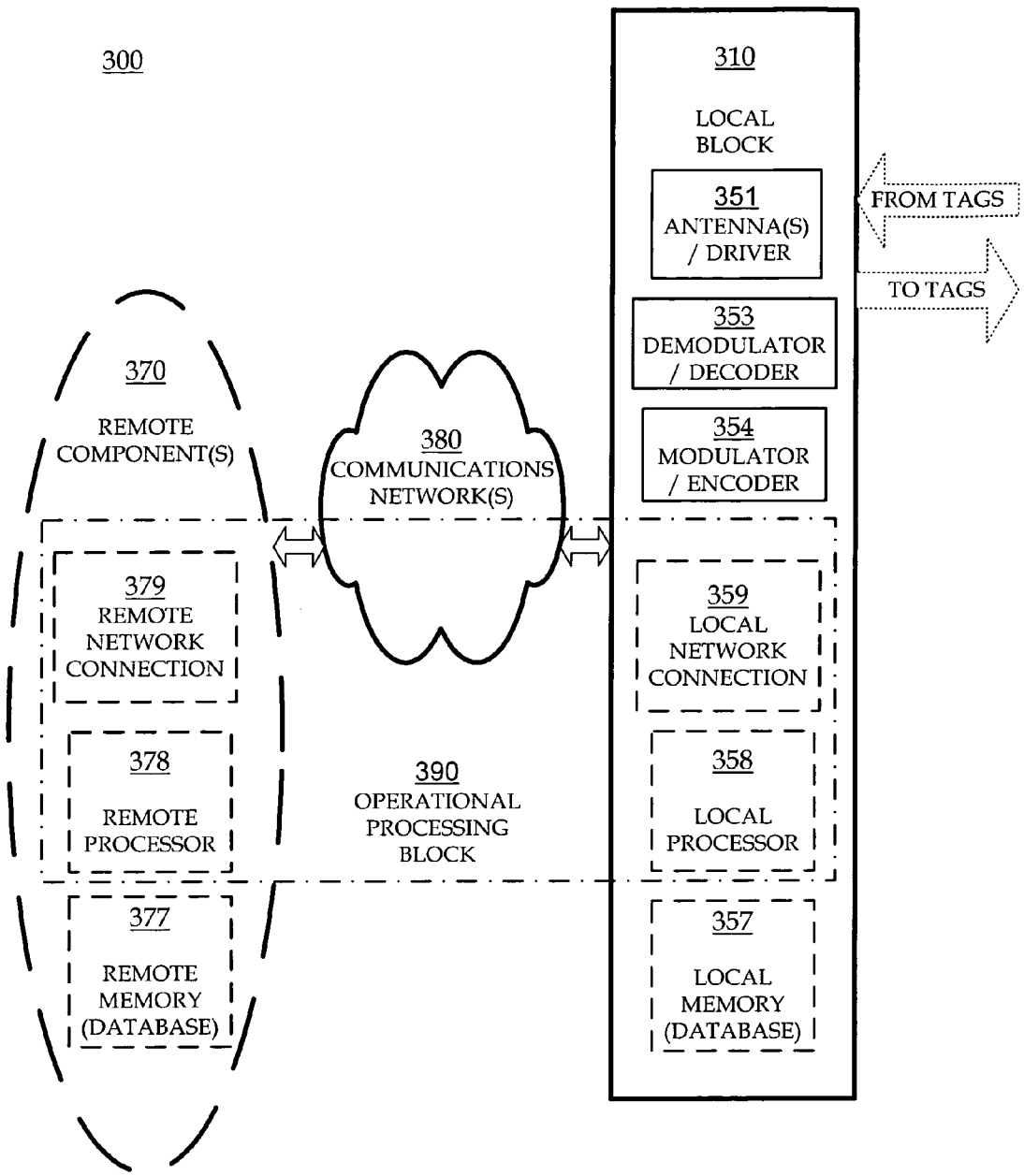
FIG. 3 is a block diagram of an RFID reader system configuration with optional local and remote components according to embodiments.

FIG. 3 is a block diagram of an RFID reader system 300 configured with optional local and remote components according to embodiments. System 300 includes a local block 310, and optionally remote components 370. Local block 310 and remote components 370 can be implemented in any number of ways. It will be recognized that reader 110 of FIG. 1 is the same as local block 310, if remote components 370 are not provided. Alternately, reader 110 can be implemented instead by system 300, of which only the local block 310 is shown in FIG. 1.

Local block 310 is responsible for communicating with the tags. Local block 310 includes a block 351 of an antenna and a driver of the antenna for communicating with the tags. Some readers, like that shown in local block 310, contain a single antenna and driver. Some readers contain multiple antennas and drivers and a method to switch signals among them, including sometimes using different antennas for transmitting and for receiving. And some readers contain multiple antennas and drivers that can operate simultaneously. A demodulator/decoder block 353 demodulates and decodes backscattered waves received from the tags via antenna block 351. Modulator/encoder block 354 encodes and modulates an RF wave that is to be transmitted to the tags via antenna block 351.

Local block 310 additionally includes an optional local processor 358. Processor 358 may be implemented in any number of ways known in the art. Such ways include, by way of examples and not of limitation, digital and/or analog processors such as microprocessors and digital-signal processors (DSPs); controllers such as microcontrollers; software running in a machine such as a general purpose computer; programmable circuits such as Field Programmable Gate Arrays (FPGAs), Field-Programmable Analog Arrays (FPAAs), Programmable Logic Devices (PLDs), and any combination of one or more of these; and so on. In some cases some or all of the decoding function in block 353, the encoding function in block 354, or both may be performed instead by processor 358.

Local block 310 additionally includes an optional local memory 357. Memory 357 may be implemented in any number of ways known in the art. Such ways include, by way of examples and not of limitation, nonvolatile memories (NVM), read-only memories (ROM), random access memories (RAM), any combination of one or more of these, and so on. Memory 357, if provided, can include programs for processor 358 to run, if provided.

In some embodiments, memory 357 stores data read from tags, or data to be written to tags, such as Electronic Product Codes (EPCs), Tag Identifiers (TIDs) and other data. Memory 357 can also include reference data that is to be compared to the EPC codes, instructions and/or rules for how to encode commands for the tags, modes for controlling antenna 351, and so on. In some of these embodiments, local memory 357 is provided as a database.

Some components of local block 310 typically treat the data as analog, such as the antenna/driver block 351. Other components such as memory 357 typically treat the data as digital. At some point there is a conversion between analog and digital. Based on where this conversion occurs, a whole reader may be characterized as "analog" or "digital", but most readers contain a mix of analog and digital functionality.

If remote components 370 are indeed provided, they are coupled to local block 310 via an electronic communications network 380. Network 380 can be a Local Area Network (LAN), a Metropolitan Area Network (MAN), a Wide Area Network (WAN), a network of networks such as the internet, and so on. In turn, local block 310 then includes a local network connection 359 for communicating with network 380.

There can be one or more remote component(s) 370. If more than one, they can be located at the same place with each other, or in different places. They can access each other and local block 310 via network 380, or via other similar networks, and so on. Accordingly, remote component(s) 370 can use respective remote network connections. Only one such remote network connection 379 is shown, which is similar to local network connection 359, etc.

Remote component(s) 370 can also include a remote processor 378. Processor 378 can be made in any way known in the art, such as was described with reference to local processor 358.

Remote component(s) 370 can also include a remote memory 377. Memory 377 can be made in any way known in the art, such as was described with reference to local memory 357. Memory 377 may include a local database, and a different database of a Standards Organization, such as one that can reference EPCs.

Of the above-described elements, it is advantageous to consider operational processing block 390. Block 390 includes those that are provided of the following: local processor 358, remote processor 378, local network connection 359, remote network connection 379, and by extension an applicable portion of network 380 that links connection 359 with connection 379. The portion can be dynamically changeable, etc. In addition, block 390 can receive and decode RF waves received via antenna 351, and cause antenna 351 to transmit RF waves according to what it has processed.

Block 390 includes either local processor 358, or remote processor 378, or both. If both are provided, remote processor 378 can be made such that it operates in a way complementary with that of local processor 358. In fact, the two can cooperate. It will be appreciated that block 390, as defined this way, is in communication with both local memory 357 and remote memory 377 if both are present.

Accordingly, block 390 is location agnostic, in that its functions can be implemented either by local processor 358, or by remote processor 378, or by a combination of both.

Some of these functions are preferably implemented by local processor 358, and some by remote processor 378. Block 390 accesses local memory 357, or remote memory 377, or both for storing and/or retrieving data.

Block 390, along with all of the circuits described in this document may be implemented as circuits in the traditional sense. All or some of them can also be implemented equivalently by other ways known in the art, such as by using one or more processors, DSPs, FPGAs, FPAAs, PLDs, combination of hardware and software, etc.

Reader system 300 operates by block 390 generating communications for RFID tags. These communications are ultimately transmitted by antenna block 351, with modulator/encoder block 354 encoding and modulating the information on an RF wave. Then data is received from the tags via antenna block 351, demodulated and decoded by demodulator/decoder block 353, and processed by processing block 390.

The operations of this description, such as those of block 390, may be implemented by one or more devices that include logic circuitry. The device(s) perform functions and/or implement methods as described in this document. The device(s) may include a processor that may be programmable for a general purpose, and/or may include a dedicated element or elements such as a microcontroller, microprocessor, DSP, etc. For example, the device(s) may be a digital-computer-like element, such as a general-purpose computer selectively activated or reconfigured by a computer program stored in the computer or in its memory. Alternately, the device may be implemented by an FPGA, FPAA, PLD, Application Specific Integrated Circuit (ASIC), etc.

The operation of a prior art RFID reader system will now be described in detail, to easily distinguish aspects of the RFID reader system of the invention from the prior art. Generally, prior art RFID readers repeat their requests for a code, until they receive a version that seems to be error free. This is described in more detail below.

Figure 4:
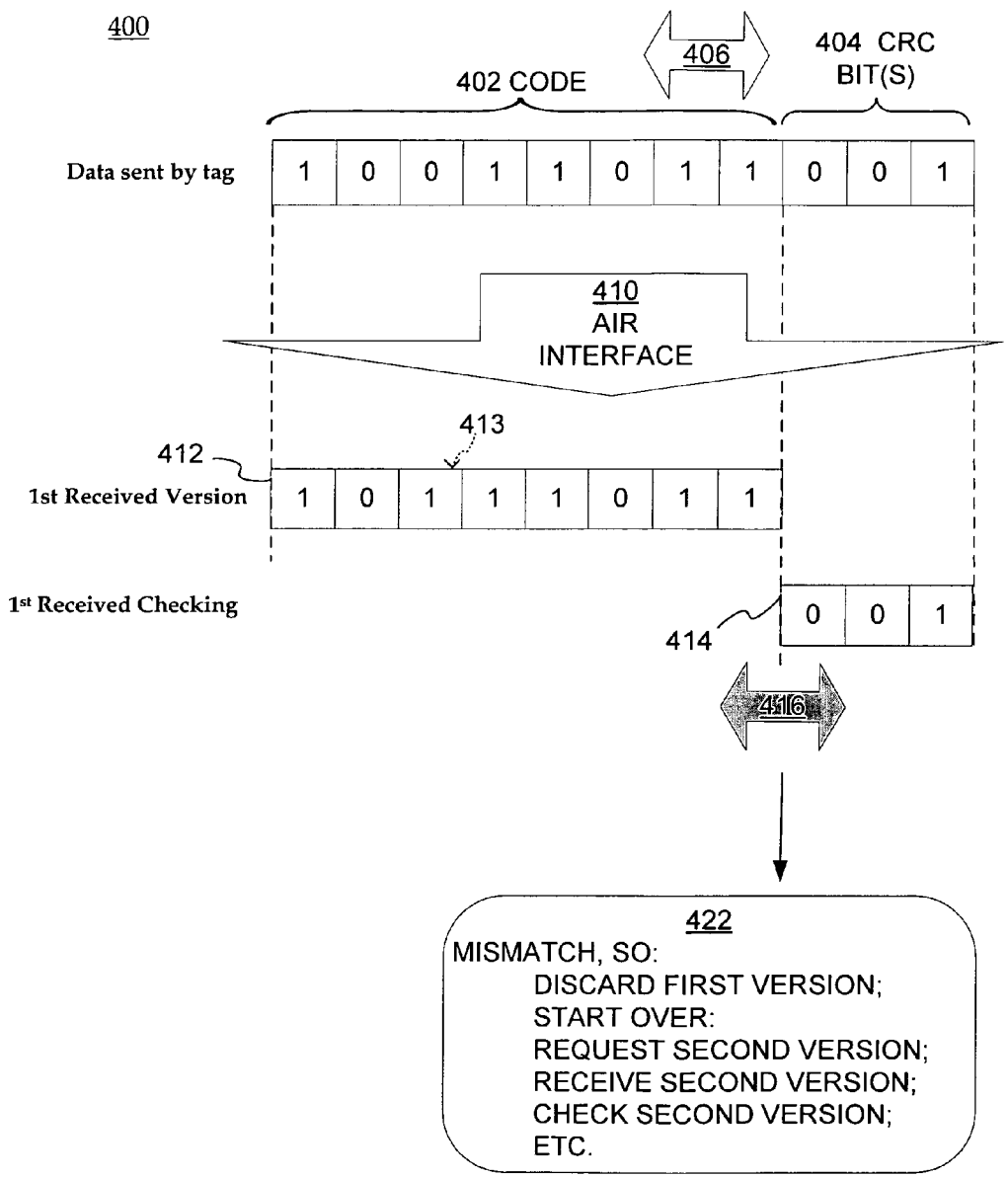
FIG. 4 is a diagram illustrating prior art processing in the event of an error, in the presence of interference.

FIG. 4 is a diagram showing a prior art process 400 of an RFID reader in the event of an error, which might occur due to interference. A tag code 402 is transmitted by an RFID tag. As previously described, code 402 may be EPCs, TIDs or other data.

Due to the possibility of error, along with tag code 402 there are also transmitted CRC bits 404. CRC bits 404 are chosen such that they have a valid correspondence 406 with tag code 402. A particular example of such a choice will be described later in this document. CRC bits 404 are redundant, in that they are not themselves part of code 402. They will be used, however, as error checking, as will be described below.

As first described in FIG. 1, RFID reader 110 receives wave 126 from the tag. Wave 126 is wireless, and travels across an air interface 410. Reader 110 then generates a first received version 412 of tag code 402.

In a perfect world, where what is received is exactly what is transmitted, first received version 412 would be identical to code 402. In this case, however, as is often the case with interference in the environment, first received version 412 contains an error at position 413, where a value "1" has replaced the correct value "0" at bit 413. From first received version 412 alone, however, the reader does not know that there is an error, or where the error is.

In this case where redundant CRC bits 404 have also been transmitted across air interface 410, a version of them is also received as CRC bits 414. Now the reader can check a correspondence 416 between received first version 412 and CRC bits 414. In this case, correspondence 416, depicted in gray shading, is not valid. As a result, the reader has learned there is an error, but it still does not know which one is the error bit.

According to a comment block 422, in the prior art, first version 412 is then discarded, and the process starts again. No portion of first version 412 is used.

A second version is requested and received, and checked to see if its correspondence is valid. If so, the second version is treated as the right one, otherwise it is discarded and another version is requested and so on.

Generating and checking CRC bits is now described in more detail. The specific CRC correspondences can be with different numbers, such as CRC-5 and CRC-16. An example CRC-16 with a valid correspondence is now described.

Figures 5A, 5B:
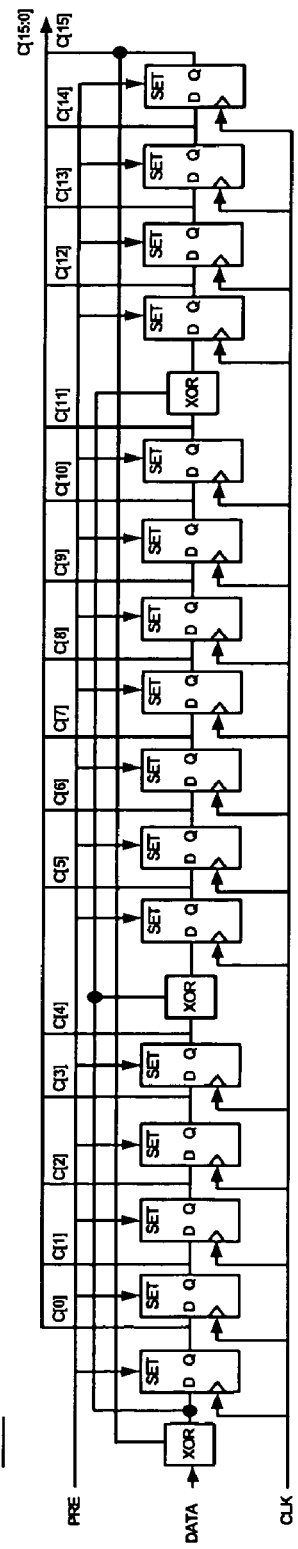
FIGS. 5A and 5B are for explaining an operation of a Cyclic Redundancy Check used in FIG. 4.

FIG. 5A is a table 500 that describes the mathematical dimension of how the CRC bits 404 are generated and assigned to have a valid correspondence, and how received bits 414 are checked to see if they have a valid correspondence.

To generate a CRC-16 a reader or a tag can first generate the CRC-16 precursor shown in FIG. 5A, and then take the ones-complement of the generated precursor to form the CRC-16.

To facilitate message verification, a reader or a tag may add the CRC-16 to the received version, and then recalculate the CRC-16. If the message is uncorrupted, then the residue will be 1D0Fh.

FIG. 5B shows an exemplary schematic diagram for a CRC-16 encoder/decoder 550, using the polynomial and preset defined in FIG. 5A.

A CRC-16 can be encoded by first preloading the entire CRC register (i.e. C[15:0]) with FFFFh, then clock the data bits to be encoded into the input labeled DATA, MSB first. After clocking in all the data bits, C[15:0] holds the ones-complement of the CRC-16 value.

A CRC-16 can be decoded by first preloading the entire CRC register (C[15:0]) with FFFFh, then clock the received data and CRC-16 {data, CRC-16} bits into the input labeled DATA, MSB first. The CRC-16 check passes if C[15:0] =1D0Fh.

Figure 6:
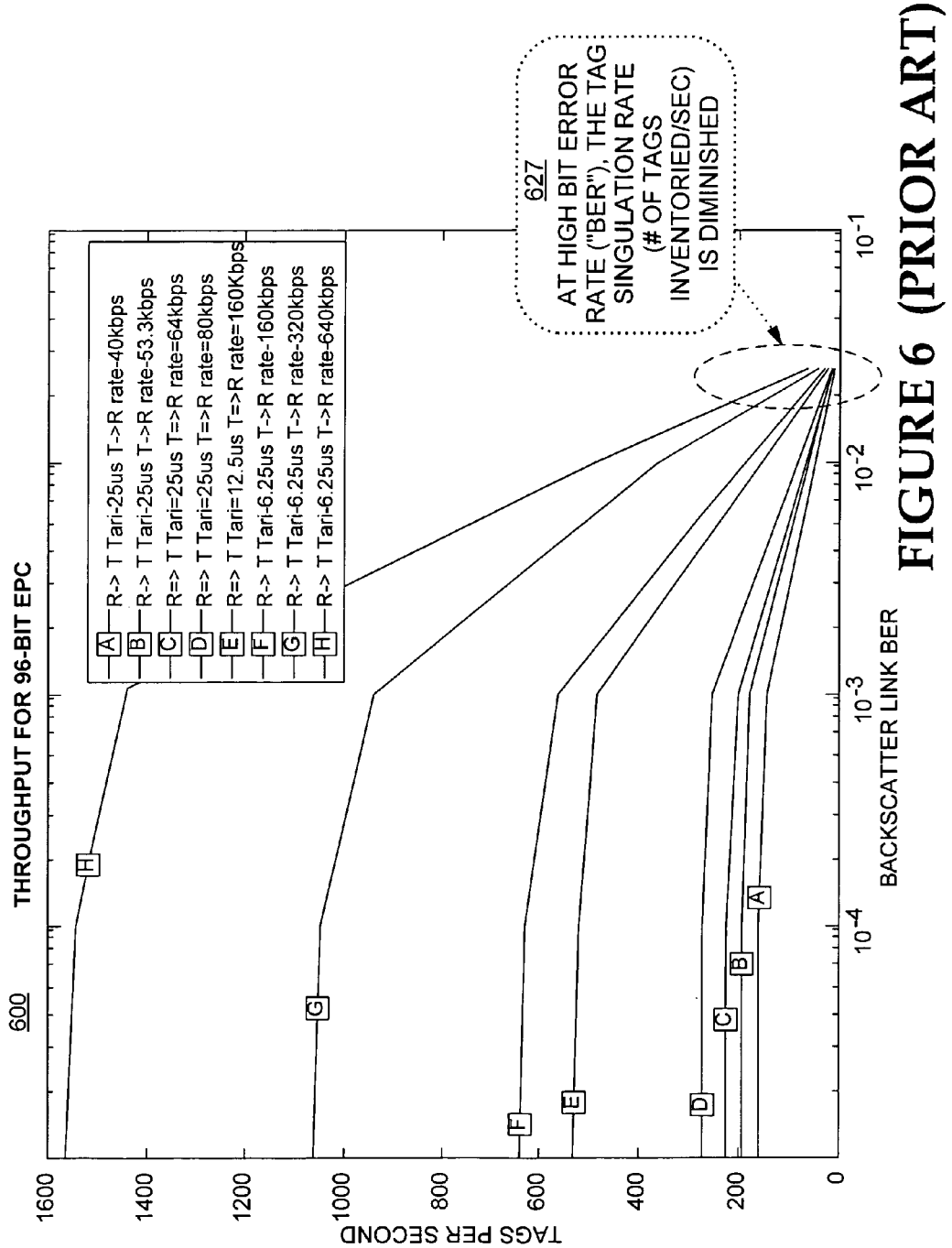
FIG. 6 is a diagram showing a simulation of tag read rate results by the prior art of FIG. 4.

FIG. 6 is a diagram 600 showing a simulation of tag read rate results for the prior art of FIG. 4. Particularly in high interference environments, the probability of the RFID reader 110 receiving one or more errors in the tag transmission is high. Therefore, the bit error rate (BER) is high for such conditions. As previously described, with each failed CRC check, the reader 110 must continue to discard existing versions of the tag code and request the next version until a CRC match is found. Consequently, the singulation rate, the rate at which the total number of tags is inventoried per second as described in a comment block 627, diminishes as shown by the arrow in FIG. 6. At high BER, the tag singulation rate becomes very slow for prior art readers.

On the contrary, according to the invention, RFID reader 110 may be configured to correct errors in received tag transmissions, and significantly improve the singulation rate over the prior art results, as will now be described in detail in the following embodiments.

Figure 7A:
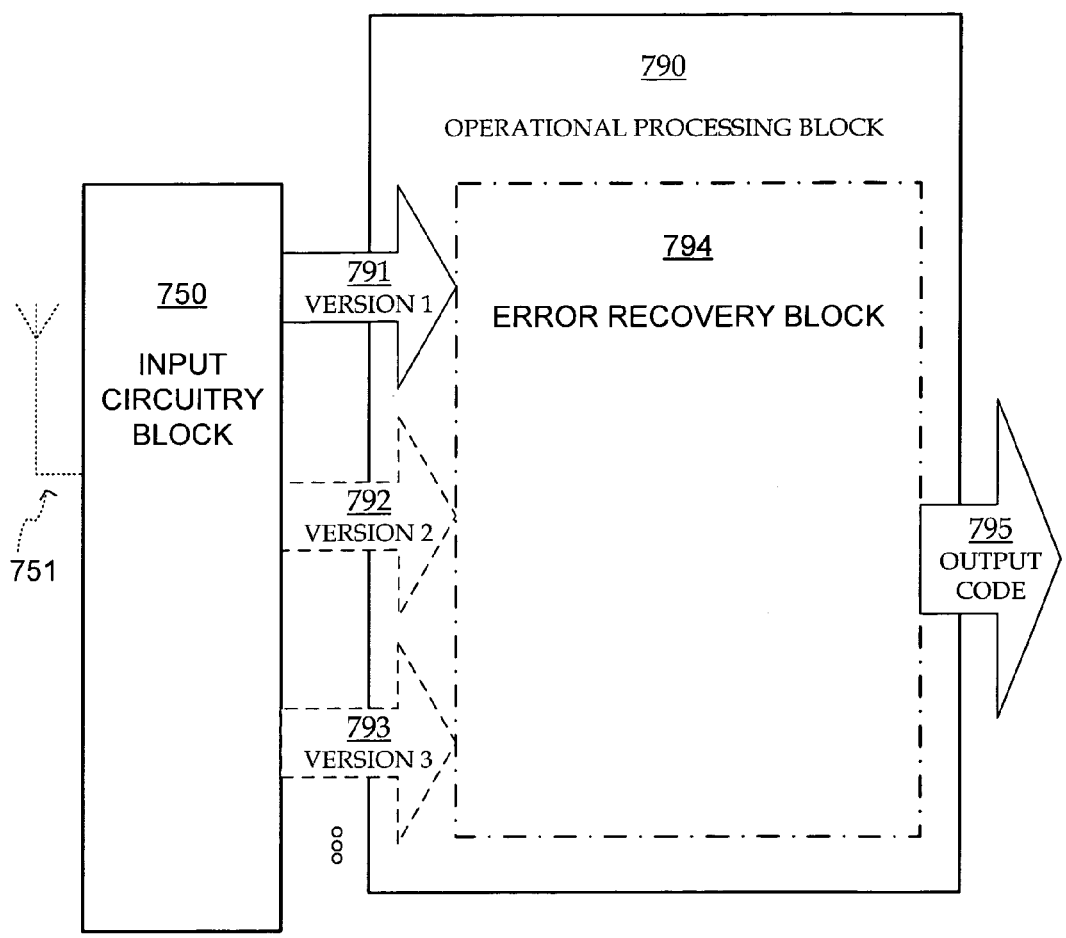
FIG. 7A is a block diagram showing components of an RFID reader system according to embodiments.

FIG. 7A is a block diagram showing the components 700 of a RFID reader system according to embodiments. In a number of embodiments, one or more antennas 751 receive wireless waves from tags, which communicate tag codes.

Components 700 include an input circuitry block 750. Block 750 may be implemented with circuits and other hardware in any number of ways, as will be apparent to a person skilled in the art in view of the present description. Block 750 then decodes from a first one of the received waves a first version 791 of the tag code.

As will be explained in more detail below, in some embodiments additional versions of the tag code are optionally decoded, such as from additionally received respective waves. These additional versions include a second version 792, a third version 793, and so on.

Components 700 also include an operational processing block 790. Block 790 may be implemented in any number of ways, for example similarly to operational processing block 390 of FIG. 3.

In addition, operational processing block 790 includes subcomponents, with additional functionality as described below. Such subcomponents can be optionally considered to be part of a distinct error recovery block 794 of block 790, or shared with other functions.

Due to these subcomponents, block 790 can determine whether a fidelity criterion is met regarding first version 791. The fidelity criterion is a measure of how much received first version 791 is trusted to be the actually transmitted code. If the fidelity criterion is met, it means that first version 791 seems error free. In that case, an output code 795 is output, which is the same as first version 791.

If the fidelity criterion is not met, however, block 790 can derive from first version 791 a final version of the tag code that is different from first version 791. Then output code 795 is the final version, instead of first version 791. Deriving the final version amounts to recovering from the error indicated in first version 791.

The subcomponents for error recovery block 794 can be implemented in any number of ways. One such way is now described.

Figure 7B:
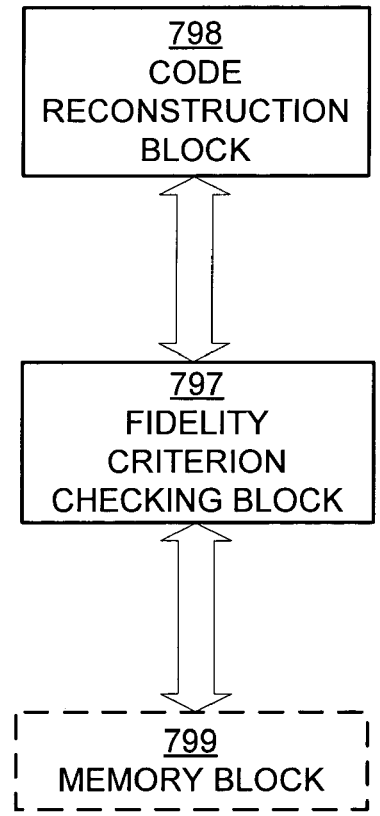
FIG. 7B is a block diagram showing subcomponents of an error recovery block of FIG. 7A according to embodiments.

FIG. 7B shows subcomponents of an error recovery block 796, according to one embodiment for block 794.

Block 796 includes a fidelity criterion checking block 797. Block 797 can determine whether the fidelity criterion is met regarding first version 791, and also optionally regarding additional versions, such as second version 792, third version 793, and so on. In addition, it is preferred that the fidelity criterion is met also regarding the final version.

Block 796 includes a code reconstruction block 798. Block 798 can derive the final version from the first version, if the fidelity criterion is not met regarding the first version. In deriving the final version, block 798 can also use those that are received from second version 792, third version 793, and so on.

The fidelity criterion can be any number of conditions, as will be apparent to a person skilled in the art. For example, it can involve additional checking bit(s) that can be decoded by the input circuitry, and the fidelity criterion can be met if a preset correspondence is met between first version 791 and the checking bit(s). The correspondence can be any type of such correspondence, such as parity type checking Cyclic Redundancy Checking, and so on. In addition, the fidelity criterion can be defined as a combination of multiple types of conditions or individual fidelity criteria.

Other ways can also be implemented. For example, first version 791 can include sampled data, whose values span a range. The fidelity criterion can be that none of the sampled data values is within a suspect window of the range.

For another example, block 796 can optionally include a memory block 799. Block 799 can store a developing statistic about previously outputted versions of other codes. In such cases, the statistic can be compared to an aspect of the first version to determine whether the fidelity criterion is met.

There can be any number of such statistics. For example, if a lot of EPC codes are being read sequentially that correspond to the same manufacturer, it might be because a truck is unloading their products. Or the codes could correspond to the same product, for example because a container (carton, crate, etc.) is being unloaded, with individually tagged items (item level tagging). A fidelity criterion can be defined in terms of whether, during such a sequence, a first version of a tag code indicates an unexpectedly different manufacturer or product, especially considering previous patterns and the like.

Moreover, methods are described below. The methods and algorithms presented herein need not be associated with any particular computer or other apparatus. Rather, various general-purpose machines may be used with programs in accordance with the teachings herein, or it may prove more convenient to construct more specialized apparatus to perform the required method steps. The required structure for a variety of these machines will become apparent from this description.

In all cases there should be borne in mind the distinction between methods provided in this description, and methods of operating a computing machine. This description relates both to methods in general, and also to methods for operating a computing machine for processing electrical or other such physical signals to generate other desired physical signals.

Programs are additionally included in this description, as are methods of operation of the programs. A program is generally defined as a group of steps leading to a desired result, due to the nature of the elements in the steps and their sequence. A program is usually advantageously implemented as a sequence of steps for a computing machine, such as a general-purpose computer, a special-purpose computer, a microprocessor, etc.

Storage media are additionally included in this description. Such media, individually or in combination with others, have stored thereon instructions of a program made according to the invention. A storage medium according to the invention is a computer-readable medium, such as a memory, and is read by the computing machine mentioned above.

Performing the steps or instructions of a program requires manipulation of physical quantities. Usually, though not necessarily, these quantities may be transferred, combined, compared, and otherwise manipulated or processed according to the steps or instructions, and they may also be stored in a computer-readable medium. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as bits, data bits, samples, values, symbols, characters, terms, numbers, or the like. It should be borne in mind, however, that all of these and similar terms are associated with the appropriate physical quantities, and that these terms are merely convenient labels applied to these physical quantities, individually or in groups.

This detailed description is presented largely in terms of flowcharts, algorithms, and symbolic representations of operations on data bits on and/or within at least one medium that allows computational operations, such as a computer with memory. Indeed, such descriptions and representations are the type of convenient labels used by those skilled in programming and/or the data processing arts to effectively convey the substance of their work to others skilled in the art. A person skilled in the art of programming may use these descriptions to readily generate specific instructions for implementing a program according to the present invention.

Often, for the sake of convenience only, it is desirable to implement and describe a program as various interconnected distinct software modules or features, individually and collectively also known as software. This is not necessary, however, and there may be cases where modules are equivalently aggregated into a single program with unclear boundaries. Furthermore, one or more modules may be advantageously implemented in a logic device such as an FPGA, FPAA, PLD, ASIC, and the like. In any event, the modules or features of this description may be implemented by themselves, or in combination with others. Even though it is said that the program may be stored in a computer-readable medium, it should be clear to a person skilled in the art that it need not be a single memory, or even a single machine. Various portions, modules or features of it may reside in separate memories, or even separate machines. The separate machines may be connected directly, or through a network such as a local access network (LAN) or a global network such as the Internet.

It will be appreciated that some of these methods may include software steps, which may be performed by different modules of an overall part of a software architecture. For example, wave shaping in a reader may be performed in a data plane, which consults a local wave-shaping table. Collecting performance data may also be performed in a data plane. The performance data may be processed in a control plane, which accordingly may update the local wave-shaping table, in addition to neighboring ones. A person skilled in the art will discern which step is best performed in which plane.

An economy is achieved in the present document in that a single set of flowcharts is used to describe both programs and methods. So, while flowcharts are described in terms of boxes, they can mean both programs and methods.

For this description, the methods may be implemented by machine operations. In other words, embodiments of programs, which may be implemented by machine operations, are made such that they perform methods of the invention described in this document. These machine operations may be optionally performed in conjunction with one or more human operators performing some, but not all of them. As per the above, the human operators need not be collocated with each other, but each only with a machine that performs a portion of the program. Alternately, some of these machines may operate automatically, without human operators and/or independently from each other.

It was described above how reader 110 and tag 120 communicate in terms of time. In addition, communications between reader 110 and tag 120 may be restricted according to frequency. One such restriction is that the available frequency spectrum may be partitioned into divisions that are called channels. Different partitioning manners may be specified by different regulatory jurisdictions and authorities (e.g. FCC in North America, CEPT in Europe, etc.).

The reader 110 typically transmits with a transmission spectrum that lies within one channel. In some regulatory jurisdictions the authorities permit aggregating multiple channels into one or more larger channels, but for all practical purposes an aggregate channel can again be considered a single, albeit larger, individual channel.

Tag 120 can respond with a backscatter that is modulated directly onto the frequency of the reader's emitted CW, also called baseband backscatter. Alternatively, tag 120 can respond with a backscatter that is modulated onto a frequency, developed by tag 120, that is different from the reader's emitter CW, and this modulated tag frequency is then impressed upon the reader's emitted CW. This second type of backscatter is called subcarrier backscatter. The subcarrier frequency can be within the reader's channel, can straddle the boundaries with the adjacent channel, or can be wholly outside the reader's channel.

A number of jurisdictions require a reader to hop to a new channel on a regular basis. When a reader hops to a new channel it may encounter RF energy there that could interfere with communications.

Embodiments of the present disclosure can be useful in different RFID environments, for example, in the deployment of RFID readers in sparse- or dense-reader environments, in environments with networked and disconnected readers such as where a hand-held reader may enter the field of networked readers, in environments with mobile readers, or in environments with other interference sources. It will be understood that the present embodiments are not limited to operation in the above environments, but may provide improved operation in such environments.

Embodiments of the disclosure provide an RFID reader that is capable of performing the methods described below. In some embodiments software is provided for controlling an RFID reader that operates as per the described methods. The software is not limited to physical locations and can be implemented as a stand-alone module or as a collection of cooperating distributed modules. The described embodiments may be performed in many ways, including by devices that can perform the described methods. Such devices can be implemented in many ways, as will be obvious to a person skilled in the art in view of the present description.

Figure 8:
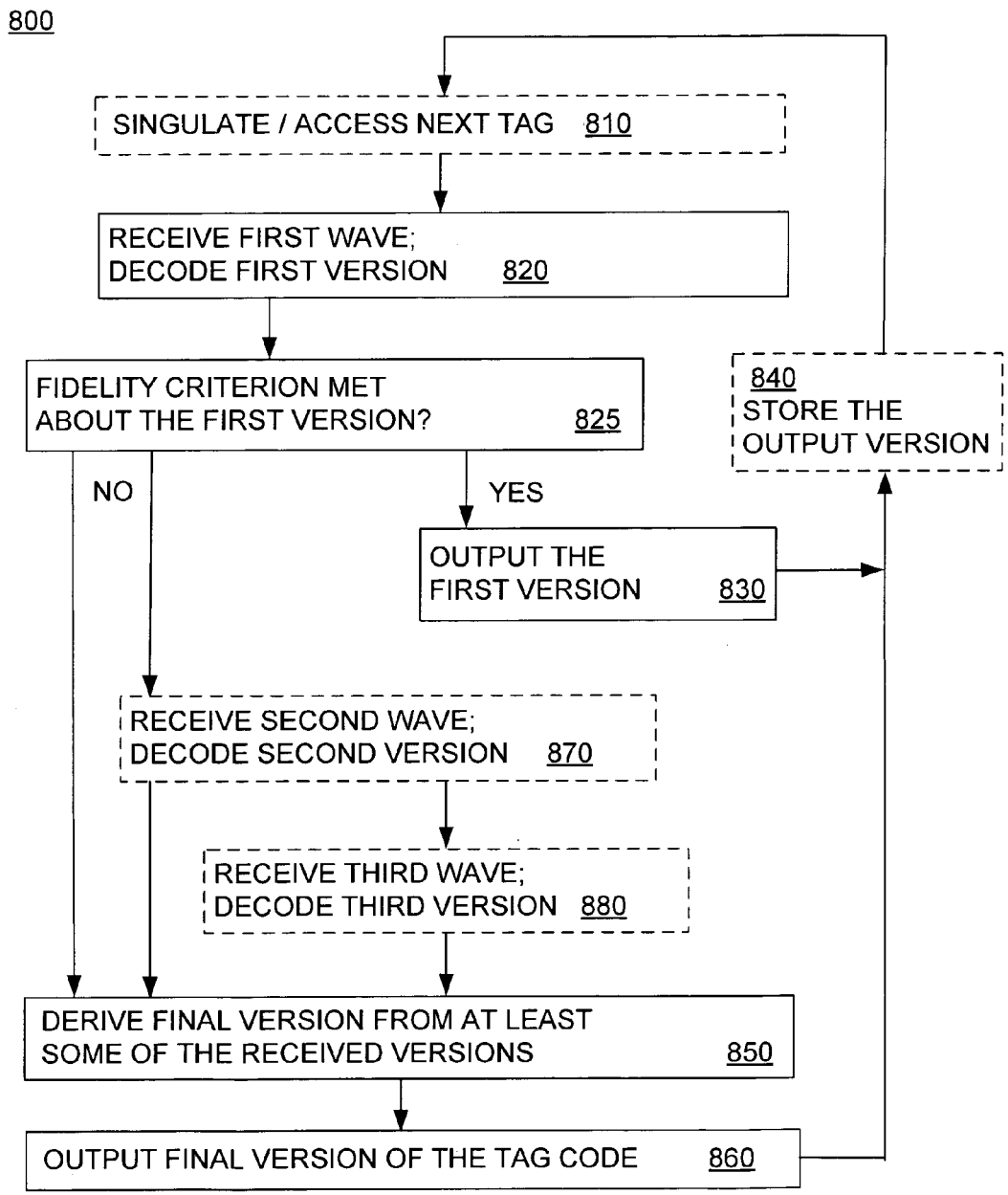
FIG. 8 is a flowchart illustrating a method for error recovery according to the embodiments.

FIG. 8 shows a flowchart 800 for describing a method or process for error recovery according to the embodiments. The method of flowchart 800 may also be practiced in a number of ways, such as the ways described in the previous embodiments. These methods may arise during inventorying of a group of RFID tags, singulation of individual tags of the group, and accessing the singulated tag to read its code.

Flowchart 800 can be deemed to start with any one operation. A convenient operation is operation 810, where a next tag may singulated, for obtaining its code. Strictly speaking, this operation 810 may be considered as optional for purposes of the invention.

According to a next operation 820, a wave is received from the tag singulated at operation 810. The wave can be thought of as the first wave that communicates the tag code, while other waves may be interposed. According to operation 820 a first version of the code is decoded. The first version could be the correct one or not, as described above.

At a next operation 825, it is determined whether a fidelity criterion is met regarding the first version. The fidelity criterion can be as described above. Determining can be performed by analyzing the received first version, also in view of how the fidelity criterion is defined.

If the fidelity criterion is met at operation 825, then according to a next operation 830, the first version of the code is outputted. In this case, the first version is regarded as being the correct one.

According to an optional next operation 840, the output version is stored. This can be performed in any number of ways, such as in memory block 799. The outputted code could then be used for defining the fidelity criterion as per the above. Then the process returns to operation 810, and continues with another tag, as per the above.

If the fidelity criterion is not met, then according to a next operation 850, a final version of the code is derived from the first received version. The final version is different from the first received version, and may be derived in a number of ways, as will be further described below.

Then according to a next operation 860 the final version is outputted, instead of the first version. The process then proceeds to operation 840, where the output version is stored.

As it will be observed, reconstruction can take place without even receiving a second version of the tag code. The final version can be derived and outputted without decoding another such version.

In other embodiments, according to an optional operation 870 following operation 825, a second wave is received from the tag, which communicates again the code. Accordingly, a second version of the same code is decoded from the second wave. In that case, according to next operation 860, the final version is derived also from the second version.

In some of these embodiments, according to a further optional operation 880 following operation 870, a third wave is received from the tag, which communicates yet again the code. Accordingly, a third version of the same code is decoded from the third wave. In that case, according to next operation 860, the final version is derived also from the third version, maybe all three or maybe a combination of them.

Manners of deriving the final version for reconstructing the tag code are now described, for the instances where the fidelity criterion is not met, and therefore it is known that there is an error. These are part of operation 850, what is performed by code reconstruction block 798, and so on.

In all these cases, the transmitted tag code and its received versions can be considered to include ordered samples. The samples can be any representation to convey the code, and can be equivalently logical bits, or waveform segments, or numerical values, or sampled data values output by an antenna of the reader, and so on.

Figure 9A:
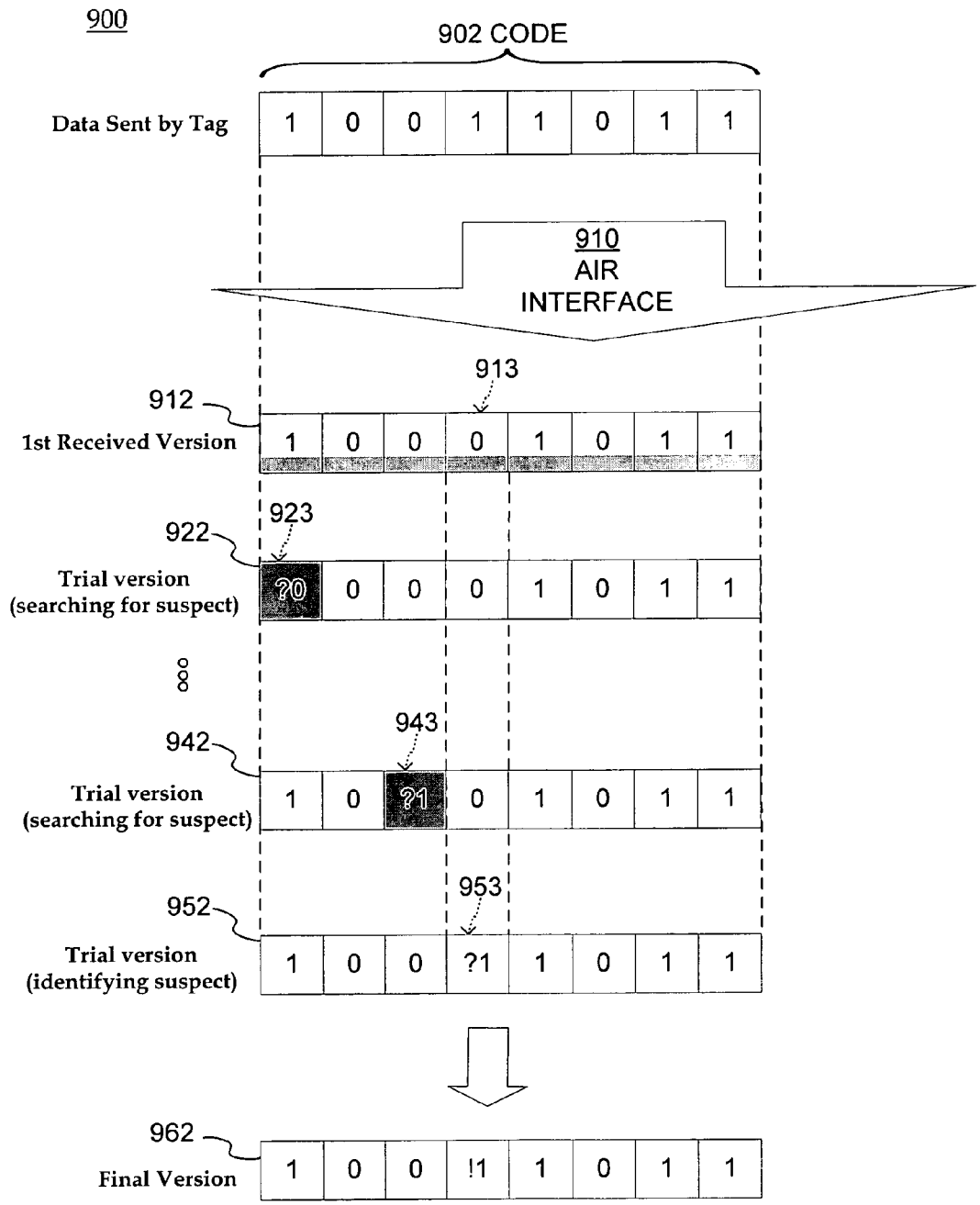
FIG. 9A shows a collection of diagrams for illustrating how a received version of a tag code that includes an error can be used to reconstruct the tag code according to embodiments.

FIG. 9A shows a collection of diagrams 900 for illustrating tag code reconstruction according to embodiments. A tag code 902 is transmitted over Air Interface 910. Tag code 902, sometimes also called "identifier", is made from logical bits 1 and 0. A corresponding first received version 912 is made also from logical bits, except that fourth bit 913 is in error, as being different from the corresponding bit of transmitted code 902.

A final version 962 is derived from first version 912, and output as per the above. Final version 962 shows the corrected sample also with an exclamation mark, but that is done only for the conceptual purpose of this drawing. It will be observed that final version 962 is corrected from first version 912, and now matches the originally transmitted version 902 in this case.

In the example of FIG. 9A, it is known that the fidelity criterion is not met. This can be known in any number of ways, which also depend on how the fidelity criterion is defined. Not all these ways necessarily involve redundant bits for checking, which is why none are shown in this example.

Since the fidelity criterion is not met, it is known that there is an error, but not as to which bit, which is why all bits of first version 912 are depicted as partly gray-shaded. All are candidates for being the suspect bit that is causing the fidelity criterion to be met, and thus probably also the bit that has been received incorrectly.

The suspect sample can be identified in a number of ways. One such way is to generate one or more trial versions by changing just one of the ordered samples of first received version 912. For each trial version it is determined whether the fidelity criterion is met. If so, the trial version becomes the final version, and identification of the suspect sample is confirmed. If not, another trial version is generated by changing another one of the samples, and so on. For example, if the samples are bits, a candidate suspect "0" can be changed to "1", and so on.

For example, a trial version 922 is derived from version 912, by changing first sample 923 from 1 to 0, but the fidelity criterion is still not met. In this case, sample 923 alone is depicted with gray shading, and the attempted value is also shown with a question mark. The question mark is conceptual, not a value, to indicate that it is a value being tried.

Then another trial version 942 is derived from version 912, by changing third sample 943 from the 0 of version 912 to a 1, but the fidelity criterion is still not met. Then yet another trial version 952 is derived from version 912, by changing fourth sample 953 from 0 to 1, and it is discovered that the fidelity criterion is met (no depiction in gray). So, final version 962 is learned from trial version 952.

Figure 9B:
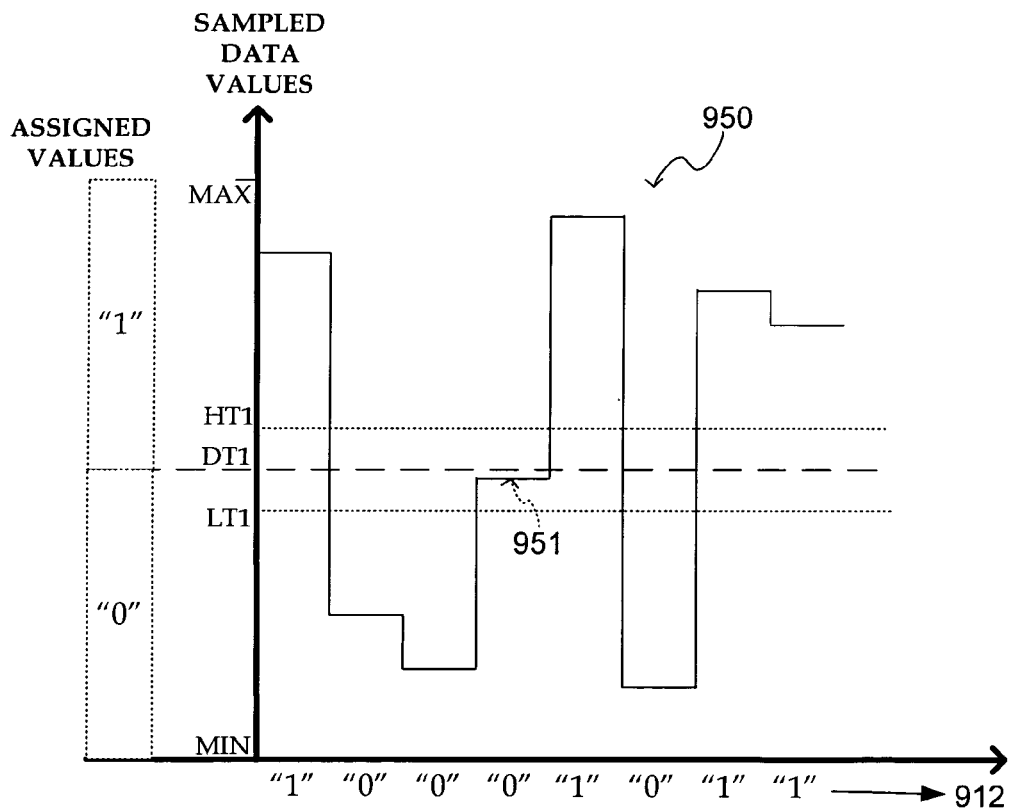
FIG. 9B is a conceptual diagram illustrating for the received code version of FIG. 9A either how a fidelity criterion can be defined, or guidance can be surmised for quickly identifying a suspect sample, or both, according to embodiments.

FIG. 9B is a conceptual diagram 909, illustrating for version 912 either how a fidelity criterion can be defined, or guidance can be surmised for quickly identifying a suspect sample, or both, according to embodiments.

In diagram 909, the vertical axis is for sampled data values, such as those detected by an antenna of a reader system, as output by, say, an Analog to Digital Converter. These values span a range between a minimum MIN, which can be 0, and a maximum MAX, which can be the full range or other value.

A first decision threshold DT1 is defined for the range. In some embodiments, a value for DT is defined as a statistic of the MIN and the MAX. For example, it can be a midway point, of midway between the modulation depth described above. In some instances, the value can be dynamically adjusted later in view of operating parameters, such as the sampled data values, how the code is reconstructed, and so on.

Decision threshold DT1 results in assigning to the sampled data values the value of "1" or "0", depending whether they are above or below DT. These values, as detected, are shown by a waveform 950.

The horizontal axis shows a representation of how the detected values of waveform 950 become assigned "1" or "0". The waveform has segments which become "1"s and "0"s, and which therefore yield the first version 912.

This depiction is conceptually illustrative, but simplified for purposes of explanation only. For example, if waveform 950 corresponds to a decoded waveform, it might require a combination of its segments for a single symbol "1" or symbol "0", not just one waveform segment. But even such combinations face problems with errors, and which the invention can solve.

Diagram 909, or an equivalent representation, can be used in a number of ways.

Diagram 909 can be used to define the fidelity criterion. For example, a suspect window can be defined, between a first low threshold LT1 and a first high threshold HT1. LT1 and HT1 could have values that include that of decision threshold DT.

In those instances, as already mentioned above, the fidelity criterion can be met if none of the sampled data values is within a suspect window of the range. For example, it can be immediately observed that waveform segment 951 is within the suspect window, and therefore decide that the fidelity criterion is not met for first received version 912.

Diagram 909 can also be used to guide identification of the suspect sample. For example, waveform segment 951 has a sampled data value that is the closest to decision threshold DT1. This could guide immediately to test the fourth bit 953, such as with trial version 952 in FIG. 9A, without trying other trial versions, and thus saving time.

Figure 10A:
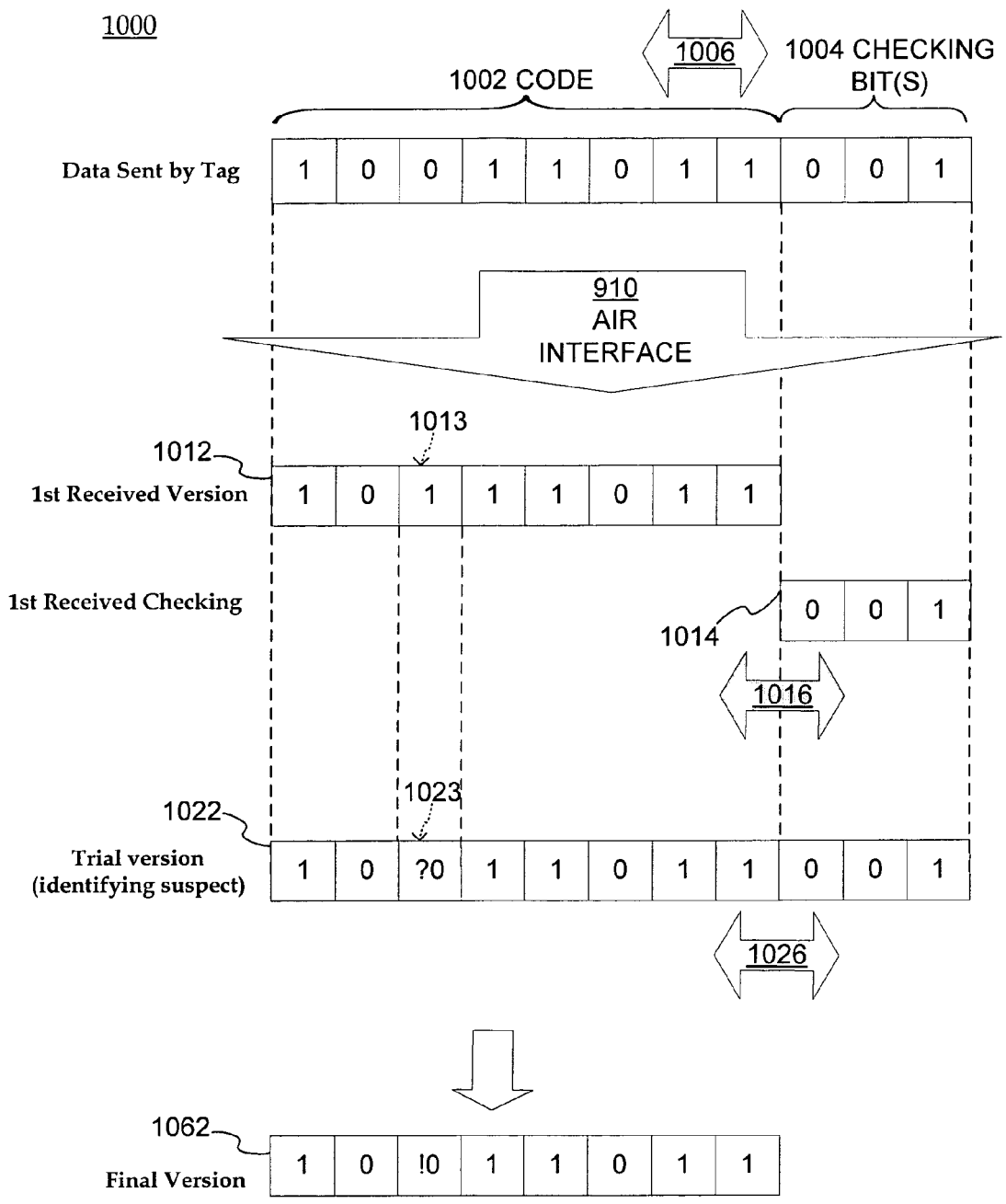
FIG. 10A shows a collection of diagrams for illustrating how a received version of a tag code that includes an error can be used to reconstruct the tag code according to embodiments.

FIG. 10A shows a collection of diagrams 1000 for illustrating tag code reconstruction according to embodiments. A tag code 1002, made from logical bits 1 and 0, is transmitted over Air Interface 910. The corresponding first received version 1012 is made from logical bits again, except that third bit 1013 is in error, as being different from the corresponding bit of transmitted code 1002.

In addition, the fidelity criterion is implemented with checking bits 1004, which have a valid correspondence 1006 with code bits 1002. The checking bits here are redundant, but that need not be the case. Correspondence 1006 can be a parity checking or CRC type checking, such as what was described above.

In the example of FIG. 10A, a version 1014 of correspondence bits 1004 is also received. Then version 1014 is checked with version 1012, to yield a correspondence 1016, which is invalid and thus depicted in gray. Now it is therefore known that the fidelity criterion is not met, but not known is which sample is the wrong one.

A final version 1062 is derived from first received version 1012. It will be observed that final version 1062 is corrected from first version 1012, and now matches the originally transmitted version 1002 in this case. It will be further observed that final version 1062 corresponds only to transmitted version 1002, without any of checking bits 1004.

Final version 1062 can be derived in any number of ways, such as what was described above. One such way is now described.

Figure 10B:
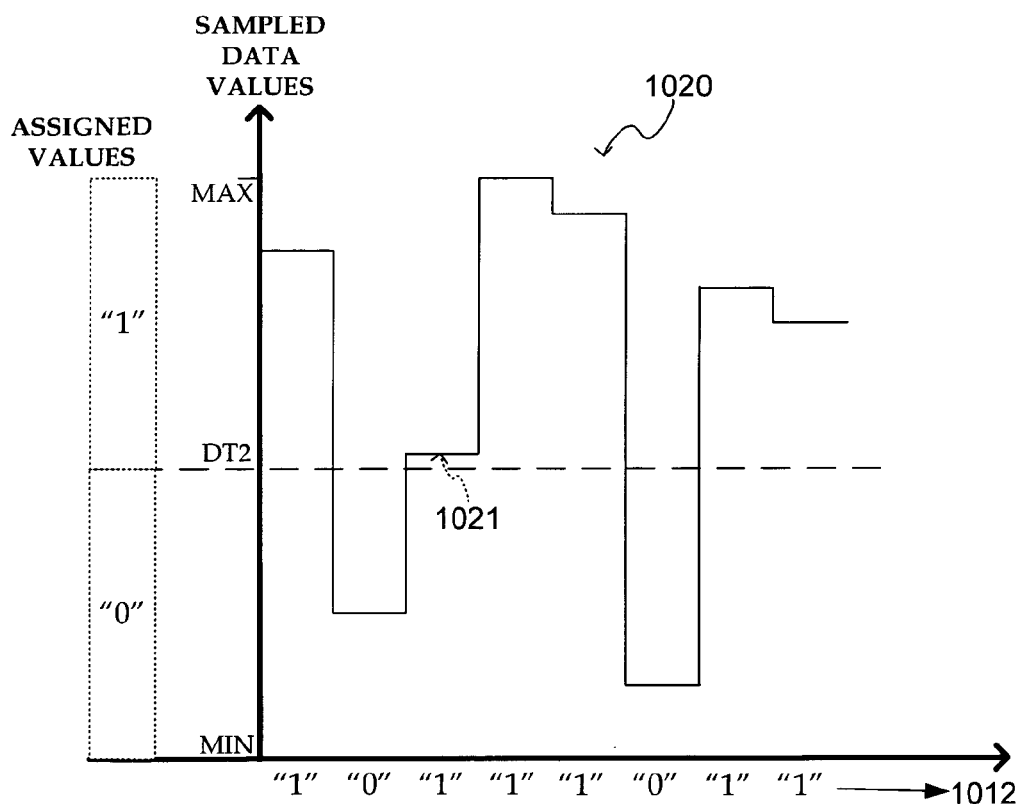
FIG. 10B is a conceptual diagram illustrating how guidance can be surmised for quickly identifying a suspect sample for the received code version of FIG. 10A, according to embodiments.

FIG. 10B is a conceptual diagram 1009, illustrating for version 1012 how guidance can be surmised for quickly identifying a suspect sample according to embodiments. In diagram 1009, the axes are as in diagram 909. In fact, the only difference is that a suspect window is not defined by thresholds around decision threshold DT2. As such, diagram 1009 is not used to define the fidelity criterion; that is instead performed by correspondence 1006, whose validity must be replicated by the received versions.

Detected or sampled data values are shown by a waveform 1020, and are assigned the value of "1" or "0", depending whether they are above or below DT2. The horizontal axis shows a representation of the assigned values, and which therefore yield first version 1012.

Diagram 1009 can also be used to guide identification of the suspect sample. For example, waveform segment 1021 of waveform 1020 has a sampled data value that is the closest to decision threshold DT2. This could guide immediately to test the third bit 1023 with a new trial version 1022 in FIG. 10A. In this case, the new correspondence 1026 is checked and found valid, which confirms the correction. Trial version 1022 becomes final version 1062, without needing to test any other trial versions, which saves time.

In the above, it will be appreciated how a final version was derived from the first version of the code, without resorting to receiving a second version. The amount of correction that results is commensurate with the robustness of the fidelity criterion. Additional robustness can be derived with a multiplicity of error checking conditions, and/or receiving and using a second version of the code from the tag. Such additional robustness may be desired where the tags are attached to very important items and the like.

Examples are now described where an additional version of the tag code is received. Such can be received upon request, either automatically for every tag, or only upon detecting that the fidelity criterion is not met for the first received version.

Figure 11A:
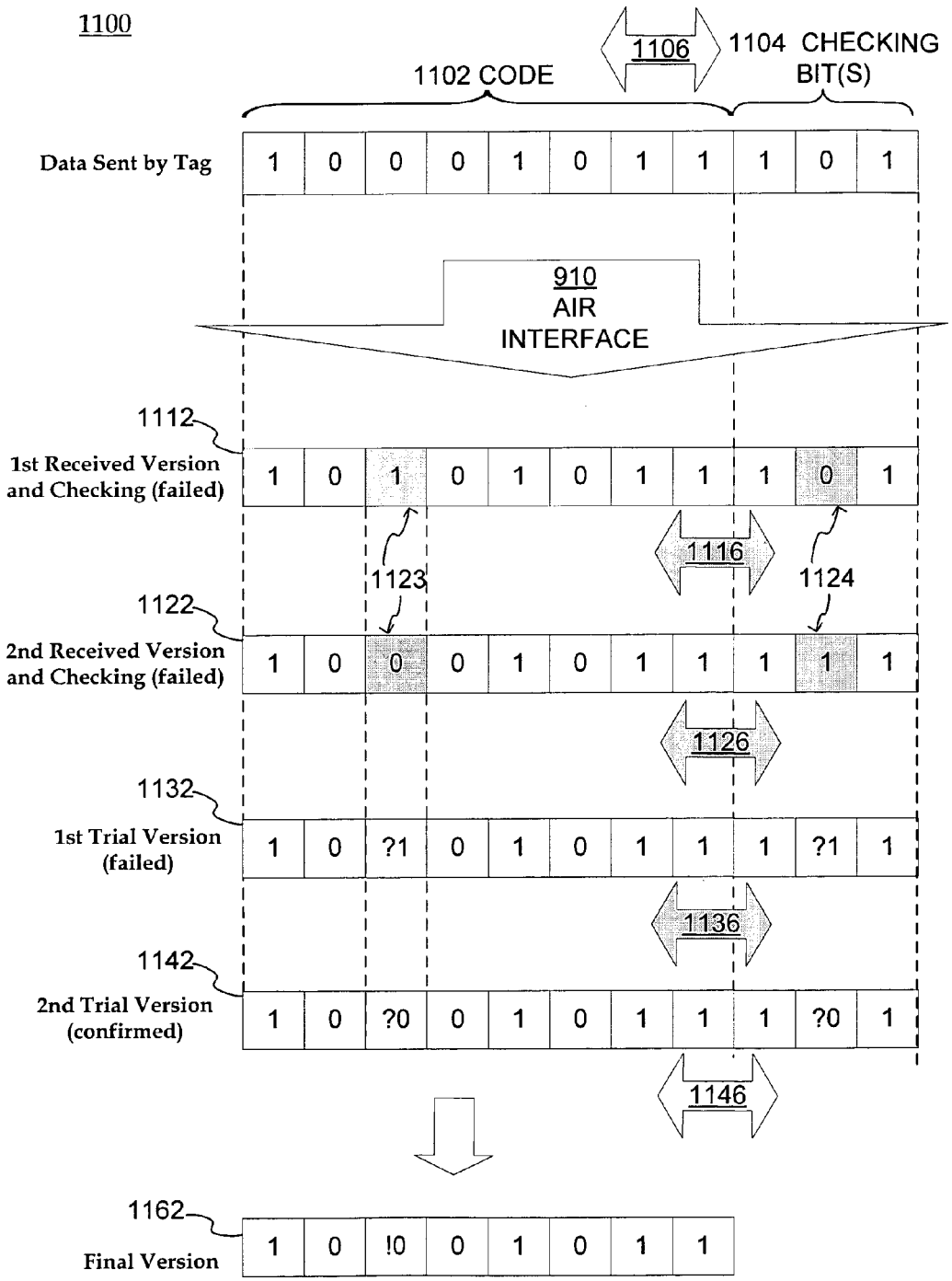
FIG. 11A shows a collection of diagrams for illustrating how two received versions of a tag code that include errors can be used to reconstruct the tag code according to embodiments.

FIG. 11A shows a collection of diagrams 1100 for illustrating tag code reconstruction according to embodiments. Tag code bits 1102 and checking bits 1104 are transmitted, and also received, twice over Air Interface 910.

A first received version 1112 is made from logical bits, except that the third bit is in error. While code bits 1102 and checking bits 1104 had a valid correspondence 1106, the bits of first received version 1112 have a correspondence 1116 that is not valid, and therefore it becomes known that the fidelity criterion is not met. It is not yet known, however, which is the suspect bit.

A second received version 1122 is made from logical bits, except that the tenth bit is in error. The bits of second received version 1122 have a correspondence 1126 that is not valid, and therefore it becomes known that the fidelity criterion is not met. If correspondence 1126 turned out to be valid, second received version 1122 could be used as the final version. Or checking might proceed anyway, for additional robustness.

A final version 1162 is derived from first version 1112 and second version 1122, and output as per the above. It will be observed that final version 1162 is corrected from first version 1112 and second version 1122, and now matches the originally transmitted version 1102 in this case.

Final version 1162 is derived by identifying and fixing the suspect sample(s). This can be performed in a number of ways.

In a number of such ways, it can be observed which ones of the bits of first version 1112 and second version 1122 are similar, and which are different, or "mismatched". Only the bits in third position 1123 and tenth position 1124 are different, and therefore uncertain. More particularly, in third position 1123, first version 1112 shows a "1", while second version 1122 shows a "0". And in tenth position 1124, first version 1112 shows a "0", while second version 1122 shows a "1".

Those bits that are similar can be treated as certain and therefore correct, and final version 1062 can include them. This narrows down the uncertainty. According to embodiments, arbitration is performed among those that are different.

Arbitrating can be performed in a number of ways. Some such ways will now be described by way of example, and not of limitation.

One such way is to generate one or more trial versions, where different permutations of uncertain bits 1123, 1124 are tried. One of these trial versions is selected as final version 1162, on the basis of a suitable criterion, or combination of criteria. Such a criterion can be to generate and check the fidelity criterion itself. This works well if only one of the trial versions meets it, and checking can stop there.

In the example of FIG. 11A, first trial version 1132 is made from the bits of received first version 1112 and second version 1122 that are similar. In addition, the third bit is "1", as indicated by first version 1112, and the tenth bit is "1", as indicated by second version 1122. A correspondence 1136 is generated for first trial version 1132, and checked. In this example, it fails, which is why trial version 1132 is rejected.

Then a second trial version 1142 is made from the bits of received first version 1112 and second version 1122 that are similar. In addition, the third bit is "0", as indicated by second version 1122, and the tenth bit is "0", as indicated by first version 1112. A correspondence 1146 is generated for second trial version 1142, and checked to see if it is valid similarly to correspondence 1106. In this example it is valid, which is why trial version 1142 is accepted, and becomes final version 1162.

In some embodiments, trial versions are made with all possible permutations of the uncertain bits. That was also done in the above example, where coincidentally checking stopped when a passing trial version 1142 was found. Then, if the fidelity criterion is met for more than one of the trial versions, additional criteria can be employed. For example, statistics of the trial versions can be compared, of the type that use numerical values, e.g. the type of values described later in connection with FIG. 11B.

In some embodiments, the final version is made from statistics of the first and second received versions. For example, when the first version includes first ordered samples, and the second version includes corresponding second ordered samples, the final version can include final corresponding ordered samples that are derived from statistics of the first ordered samples and the second ordered samples.

These embodiments are analogous to the embodiments of FIG. 11A, because those of the first samples that are similar to their corresponding second samples will yield agreeing statistics. The different samples will also yield statistics, which will provide answers. For examples, statistics can include averaging, weighted averaging, etc. An example is given below.

Figure 11B:
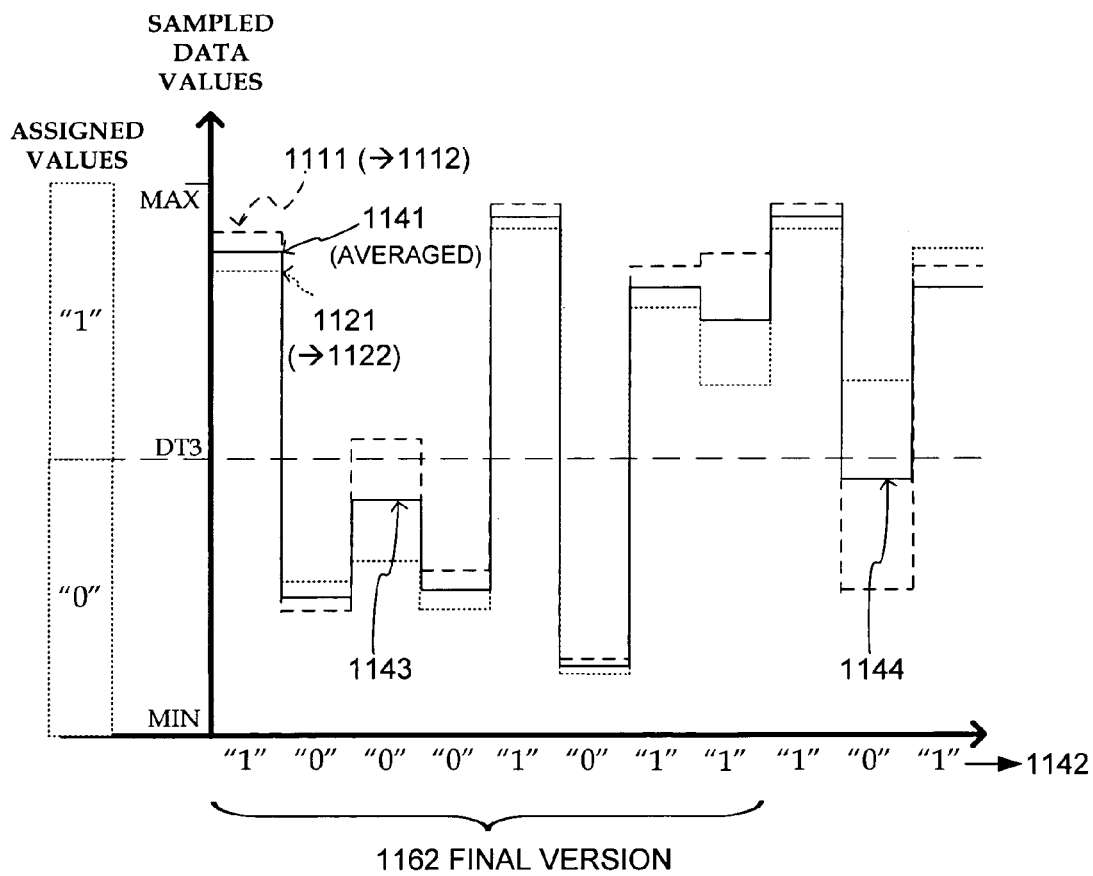
FIG. 11B is a conceptual diagram illustrating how a tag code can be reconstructed substantially robustly from two of its received versions, such as the versions of FIG. 11A according to embodiments.

FIG. 11B is a conceptual diagram 1109, illustrating how final tag code 1162 can be reconstructed substantially robustly from two of its received versions, such as versions 1112 and 1122 of FIG. 11A according to embodiments. In diagram 1109, the axes are as in diagram 909. In fact, the only difference is that a suspect window is not defined by thresholds around decision threshold DT3. As such, diagram 1109 is not used to define the fidelity criterion. In other embodiments, however, a suspect window can be so defined, and used alone or in conjunction with other criteria for the fidelity criterion.

Samples here are detected or sampled data values. The samples are assigned the value of "1" or "0", depending whether they are above or below DT3. A first waveform 1111 shows those samples that generated first received version 1112, and a second waveform 1121 shows those that generated first received version 1122.

As per the above, a statistic can be obtained from these samples, to derive a trial version, or even the final version. In this particular example, the statistic is averaging. A trial waveform 1141 can be derived from first waveform 1111 and second waveform 1121. Then the horizontal axis shows a representation of the assigned values. It will be observed that trial waveform 1141 thus yields directly trial version 1142, without the need to generate other trial versions, such as trial version 1132.

Final version 1162 can be derived from the first 8 bits of the yielded trial version 1142, either directly, or after determining correspondence 1146 and checking that it is valid.

Alternately, trial waveform 1141 can be considered to have arbitrated by its values 1143 and 1144, while the other samples of final version 1142 can be taken from the common ones of first received version 1112 and second received version 1122.

Either way, it will be noted that these embodiments do not even require that the exact tag code be one of the received versions. Reconstruction is substantially robust because of how the embodiments work.

Figure 12:
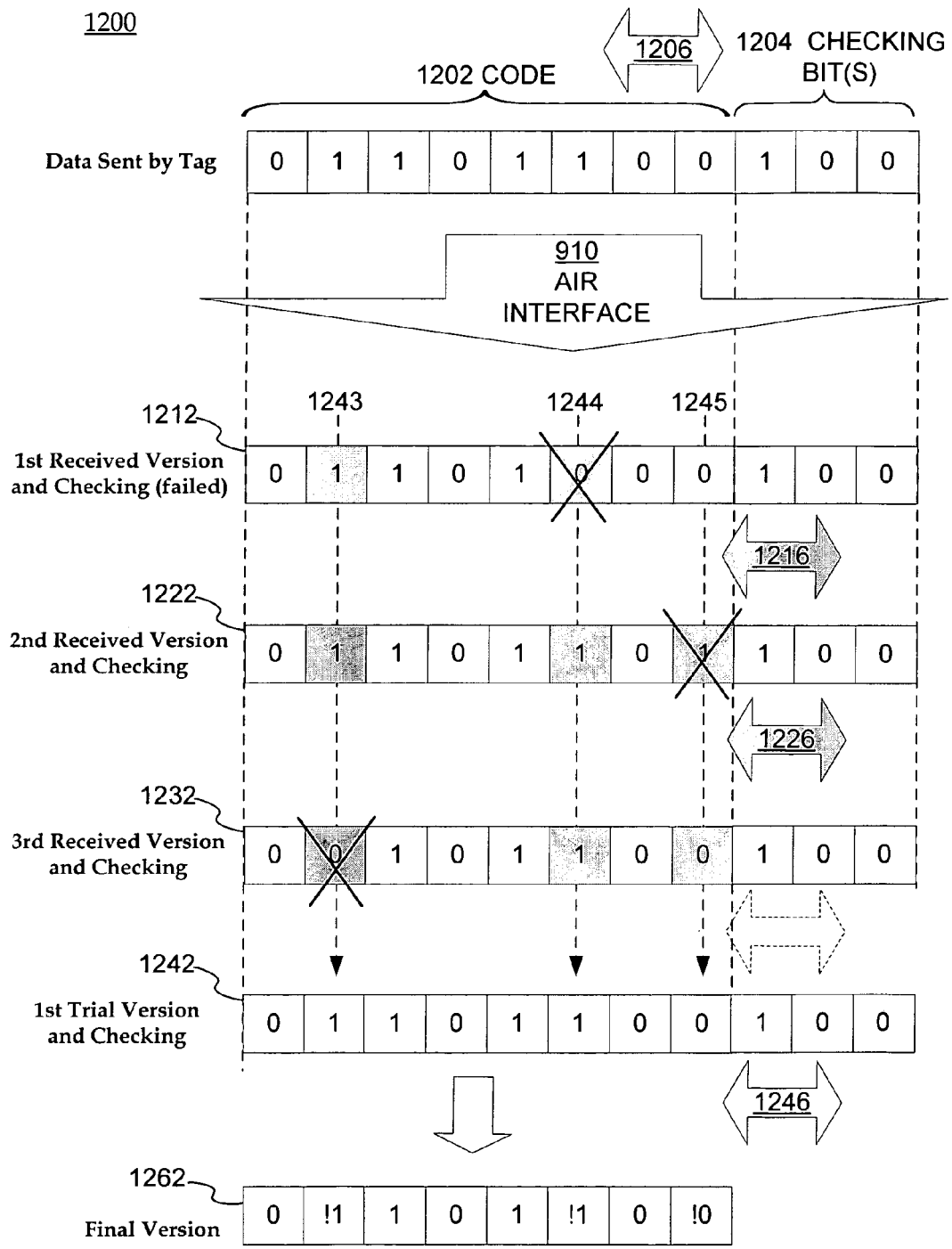
FIG. 12 shows a collection of diagrams for illustrating how a tag code can be reconstructed substantially robustly from three of its received versions, according to embodiments.

FIG. 12 shows a collection of diagrams 1200 for illustrating how a tag code 1202 can be reconstructed from three of its received versions, according to embodiments. The tag code 1202 is accompanied with checking bits 1204, having a correspondence 1206.

As previously described, a first version 1212 is received. A correspondence 1216 is generated, checked, and found not valid. Then a second version 1222 is received, and a correspondence 1226 is generated, checked, and found not valid.

At this point, resolution could be as described above in FIGS. 11A and 11B. Or a decision could be to receive an additional version by first requesting one, and so on. A number of criteria can be employed for determining whether the third version is to be received. For example, it could be if first version 1212 had too many samples that are different than second version 1222, such as more different samples than a threshold.

For the embodiment of FIG. 12, a third version 1232 is received. In a number of these embodiments, there is no interest in checking a correspondence as to the third version. In others, such a correspondence is checked, and so on.

Then a first trial version 1242 is assembled. It includes the samples for the three received versions 1212, 1222, 1232 that are the same. The different samples are for the second slot 1243, sixth slot 1244, and eighth slot 1245. For each of these slots, trial version 1242 arbitrates between the samples of the three received versions 1212, 1222, 1232.

Arbitrating may be performed in a number of different ways. Some such ways involve the type of statistics described above.

In the embodiment of FIG. 12, arbitrating is performed by majority voting between the first, second and third samples, where they are different. So, slot 1243 is tried as a "1", because two of the received versions showed a "1", while only one of them showed a "0". Similarly, slot 1244 is tried as a "1", and slot 1245 is tried as a "0".

Then a correspondence 1246 is optionally generated and checked for trial version 1242. In this example, it is found valid. Then final version 1262 is generated by selecting the corresponding code bits of trial version 1242.

Variations of the above examples are also possible. For example, an intermediately received version of the tag code could be discarded, without contributing to the final version.

Figure 13:
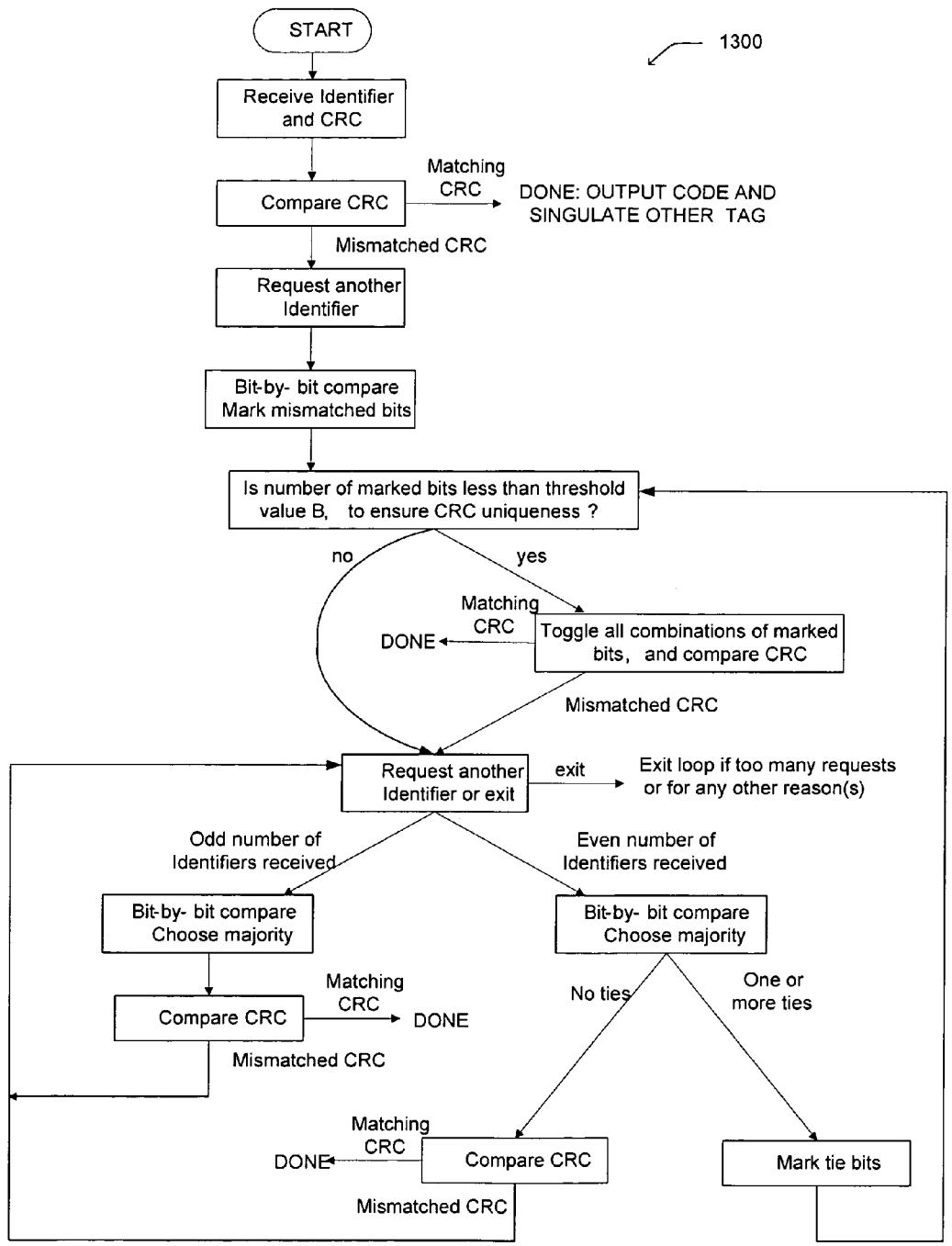
FIG. 13 is a flowchart illustrating a method for error recovery according to the embodiments.

FIG. 13 is a flowchart 1300 illustrating a method for error recovery according to the embodiments. It will be recognized that the self-explanatory operations of flowchart 1300 implement a combination of a number of the above-described embodiments.

Figure 14:
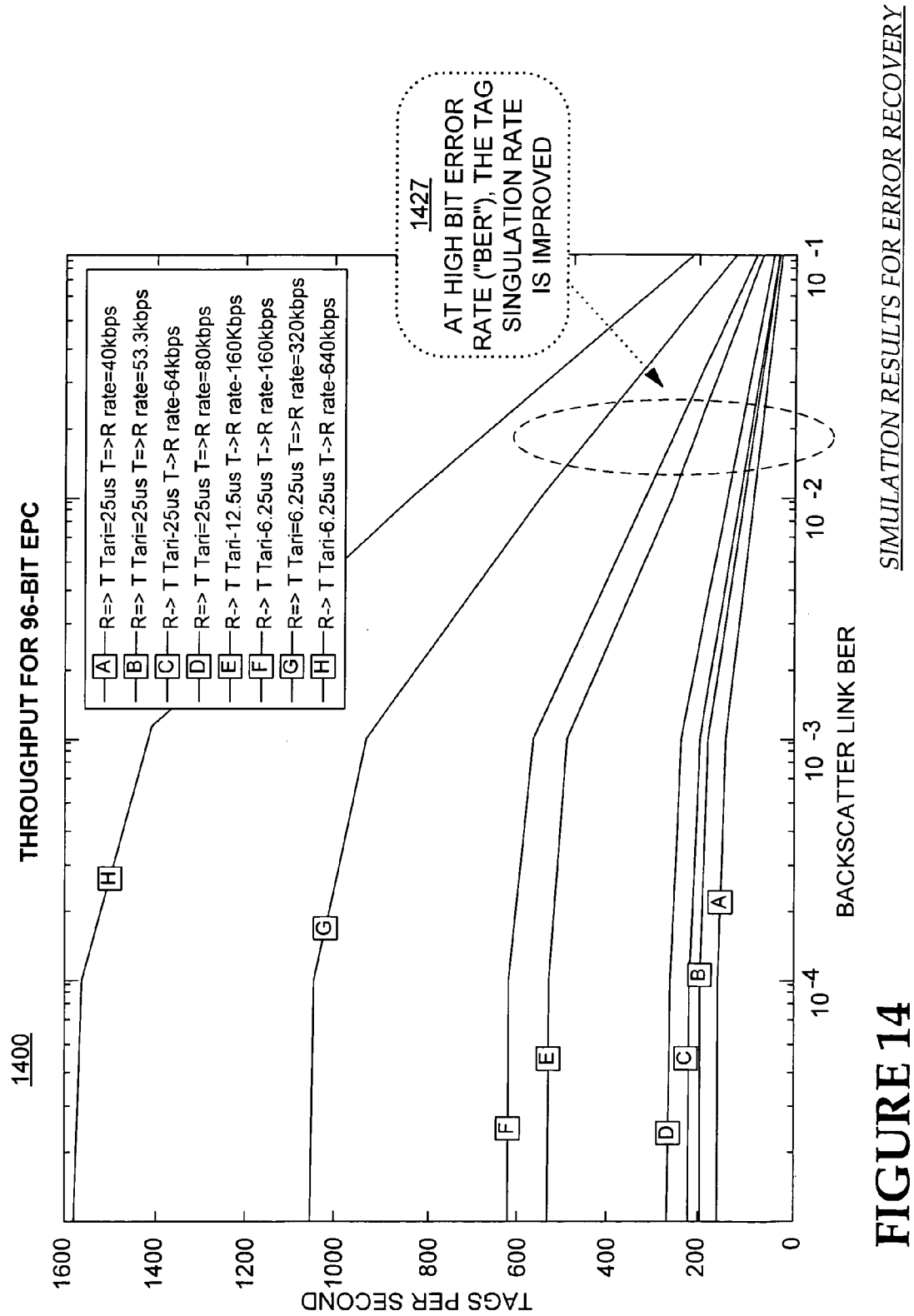
FIG. 14 is a diagram showing a simulation of read rates resulting from embodiments, in the presence of interference.

FIG. 14 is a diagram 1400 showing a simulation of read rates resulting from embodiments, in the presence of interference. As previously described for diagram 600 of FIG. 6, bit error rates are high in high interference environments. Compared to the diagram 600, diagram 1400 shows a significant improvement in the tag singulation rate, as indicated in a comment block 1427, for simulation results from the described embodiments.

In this description, numerous details have been set forth in order to provide a thorough understanding. In other instances, well-known features have not been described in detail in order to not obscure unnecessarily the description.

A person skilled in the art will be able to practice the present invention in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and subcombinations of elements, features, steps, and/or functions, which are regarded as novel and non-obvious. Additional claims for other combinations and subcombinations may be presented in this or a related document.

What is claimed is:

1. An RFID reader system for outputting a code of an RFID tag from waves received by a reader antenna, comprising:
   input circuitry operable to decode from a first one of the waves a first version of the code; and an operational processing block operable to determine whether a fidelity criterion regarding the first version is met, and if so to output the first version of the code, else to derive from the first version a final version of the code that is different from the first version, and to output the final version instead of the first version.

2. The system of claim 1, in which operational processing block includes
a fidelity criterion checking block operable to determine whether the fidelity criterion is met, and
a code reconstruction block operable to derive the final version, if the fidelity criterion regarding the first version is not met.

3. The system of claim 1, in which the fidelity criterion is met regarding the final version.

4. The system of claim 1, in which
the input circuitry operable to further decode from the first wave at least one checking bit, and
in which the fidelity criterion is met if a preset correspondence between the first version and the checking bit is met.

5. The system of claim 4, in which
the correspondence is a parity type checking.

6. The system of claim 4, in which
the correspondence is a Cyclic Redundancy Checking.

7. The system of claim 1, in which
the first version includes sampled data values that span a range, and
the fidelity criterion is met if none of the sampled data values is within a suspect window of the range.

8. The system of claim 1, further comprising:
a memory block operable to store a developing statistic about previously outputted versions of other codes, and
in which the statistic is compared to an aspect of the first version to determine whether the fidelity criterion is met.

9. The system of claim 1, in which
the first version includes first ordered samples at least one of which is suspect,
a first trial version is generated from most of the first ordered samples, but with changing the suspect sample, and
the first trial version becomes the final version if the fidelity criterion is met regarding the first trial version.

10. The system of claim 9, in which
the samples are logical bits.

11. The system of claim 9, in which
a second trial version is generated that is different from the first trial version and from the first received version, if the fidelity criterion is met regarding the first trial version, and
the second trial version becomes the final version if the fidelity criterion is met regarding the second trial version.

12. The system of claim 9, in which
the samples correspond to respective sampled data values that span a range, and
the suspect sample is identified as being the one whose sampled data value is closest to a decision threshold of the range.

13. The system of claim 12, in which
the range is between a minimum and a maximum, and
the decision threshold is derived as a statistic of the minimum and the maximum.

14. The system of claim 12, in which
the decision threshold becomes adjusted later responsive to the sampled data values.

15. The system of claim 1, in which
the final version is derived and outputted without decoding another version of the code.

16. The system of claim 1, in which
the input circuitry is further operable to decode from a second one of the waves a second version of the code, and
the reconstruction block is operable to derive the final version also from the second version.

17. The system of claim 16, in which
the first version includes first ordered samples,
the second version includes second ordered samples that correspond to the first ordered samples, and
the final version is derived from the first and second samples that are similar, and by arbitrating between the first and the second samples that are different.

18. The system of claim 17, in which
the first and second samples are logical bits.

19. The system of claim 17, in which
arbitrating is performed by
generating a trial version from at least one the first version and the second version, and
determining whether the fidelity criterion is met for the trial version.

20. The system of claim 16, in which
the first version includes first ordered samples,
the second version includes second ordered samples that correspond to the first ordered samples, and
the final version includes final ordered samples that correspond to and are derived from statistics of the first ordered samples and the second ordered samples.

21. The system of claim 16, in which
the input circuitry is further operable to decode from a third one of the waves a third version of the code, and
the reconstruction block is operable to derive the final version also from the third version.

22. The system of claim 21, in which
the first version includes first ordered samples,
the second version includes second ordered samples that correspond to the first ordered samples, and
the third version is received if a number of the first samples and the second samples that are different exceeds a threshold.

23. The system of claim 21, in which
the first version includes first ordered samples,
the second version includes second ordered samples that correspond to the first ordered samples,
the third version includes third ordered samples that correspond to the first and the second ordered samples, and
the final version is derived from the first, second and third samples that are similar, and by arbitrating between the first, second and third samples that are different.

24. The system of claim 23, in which
arbitrating is performed by majority voting between the first, second and third samples, where they are different.

25. A method for an RFID reader system to output a code of a first RFID tag, comprising:
receiving from the tag a first wave;
decoding from the first wave a first version of the code;
determining whether a fidelity criterion regarding the first version is met; and
if so, outputting the first version of the code,
else if not, deriving from the first version a final version of the code that is different from the first version, and outputting the final version instead of the first version.

26. The method of claim 25, in which
the fidelity criterion is met regarding the final version.

27. The method of claim 25, further comprising:
decoding from the first wave at least one checking bit, and
in which the fidelity criterion is met if a preset correspondence between the first version and the checking bit is met.

28. The method of claim 27, in which
the correspondence is a parity type checking.

29. The method of claim 27, in which
the correspondence is a Cyclic Redundancy Checking.

30. The method of claim 25, in which
the first version includes sampled data values that span a range, and
the fidelity criterion is met if none of the sampled data values is within a suspect window of the range.

31. The method of claim 25, further comprising:
storing a developing statistic about previously outputted versions of other codes, and
in which the statistic is compared to an aspect of the first version to determine whether the fidelity criterion is met.

32. The method of claim 25, in which
the first version includes first ordered samples at least one of which is suspect,
a first trial version is generated from most of the first ordered samples, but with changing the suspect sample, and
the first trial version becomes the final version if the fidelity criterion is met regarding the first trial version.

33. The method of claim 32, in which
the samples are logical bits.

34. The method of claim 32, in which
a second trial version is generated that is different from the first trial version and from the first received version, if the fidelity criterion is met regarding the first trial version, and
the second trial version becomes the final version if the fidelity criterion is met regarding the second trial version.

35. The method of claim 32, in which
the samples correspond to respective sampled data values that span a range, and
the suspect sample is identified as being the one whose sampled data value is closest to a decision threshold of the range.

36. The method of claim 35, in which
the range is between a minimum and a maximum, and
the decision threshold is derived as a statistic of the minimum and the maximum.

37. The method of claim 35, in which
the decision threshold becomes adjusted later responsive to the sampled data values.

38. The method of claim 25, in which
the final version is derived and outputted without decoding another version of the code.

39. The method of claim 25, further comprising:
receiving from the tag a second wave;
decoding from the second wave a second version of the code, and
in which the final version is derived also from the second version.

40. The method of claim 39, in which
the first version includes first ordered samples,
the second version includes second ordered samples that correspond to the first ordered samples, and
the final version is derived from the first and second samples that are similar, and by arbitrating between the first and the second samples that are different.

41. The method of claim 40, in which
the first and second samples are logical bits.

42. The method of claim 40, in which
arbitrating is performed by
generating a trial version from at least one the first version and the second version, and
determining whether the fidelity criterion is met for the trial version.

43. The method of claim 39, in which
the first version includes first ordered samples,
the second version includes second ordered samples that correspond to the first ordered samples, and
the final version includes final ordered samples that correspond to and are derived from statistics of the first ordered samples and the second ordered samples.

44. The method of claim 39, further comprising:
receiving from the tag a third wave;
decoding from the third wave a third version of the code, and
in which the final version is derived also from the third version.

45. The method of claim 44, in which
the first version includes first ordered samples,
the second version includes second ordered samples that correspond to the first ordered samples, and
the third version is received if a number of the first samples and the second samples that are different exceeds a threshold.

46. The method of claim 44, in which
the first version includes first ordered samples,
the second version includes second ordered samples that correspond to the first ordered samples,
the third version includes third ordered samples that correspond to the first and the second ordered samples, and
the final version is derived from the first, second and third samples that are similar, and by arbitrating between the first, second and third samples that are different.

47. The method of claim 46, in which
arbitrating is performed by majority voting between the first, second and third samples, where they are different.

48. An RFID reader system comprising:
receiving means for receiving from an RFID tag a first wave;
decoding means for decoding from the first wave a first version of a code of the tag;
determining means for determining whether a fidelity criterion regarding the first version is met;
deriving means for deriving from the first version a final version of the code that is different from the first version, and
outputting means for outputting the first version of the code if the fidelity criterion is met regarding the first version, and the final version instead of the first version otherwise.

49. The system of claim 48, in which
the fidelity criterion is met regarding the final version.

50. The system of claim 48, in which
the decoding means is operable to further decode from the first wave at least one checking bit, and
the fidelity criterion is met if a preset correspondence between the first version and the checking bit is met.

51. The system of claim 50, in which
the correspondence is a parity type checking.

52. The system of claim 50, in which
the correspondence is a Cyclic Redundancy Checking.

53. The system of claim 48, in which
the first version includes sampled data values that span a range, and
the fidelity criterion is met if none of the sampled data values is within a suspect window of the range.

54. The system of claim 48, in which
the first version includes first ordered samples at least one of which is suspect,
a first trial version is generated from most of the first ordered samples, but with changing the suspect sample, and
the first trial version becomes the final version if the fidelity criterion is met regarding the first trial version.

55. The system of claim 54, in which
the samples are logical bits.

56. The system of claim 54, in which
a second trial version is generated that is different from the first trial version and from the first received version, if the fidelity criterion is met regarding the first trial version, and
the second trial version becomes the final version if the fidelity criterion is met regarding the second trial version.

57. The system of claim 54, in which
the samples correspond to respective sampled data values that span a range, and
the suspect sample is identified as being the one whose sampled data value is closest to a decision threshold of the range.

58. The system of claim 57, in which
the range is between a minimum and a maximum, and
the decision threshold is derived as a statistic of the minimum and the maximum.

59. The system of claim 48, in which
the final version is derived and outputted without decoding another version of the code.

60. The system of claim 48, in which
the receiving means is operable to receive from the tag a second wave,
the decoding means is operable to decode from the second wave a second version of the code, and
the final version is derived also from the second version.

61. The system of claim 60, in which
the first version includes first ordered samples,
the second version includes second ordered samples that correspond to the first ordered samples, and
the final version is derived from the first and second samples that are similar, and by arbitrating between the first and the second samples that are different.

62. The system of claim 61, in which
the first and second samples are logical bits.

63. The system of claim 61, in which
arbitrating is performed by
generating a trial version from at least one the first version and the second version, and
determining whether the fidelity criterion is met for the trial version.

64. The system of claim 60, in which
the first version includes first ordered samples,
the second version includes second ordered samples that correspond to the first ordered samples, and
the final version includes final ordered samples that correspond to and are derived from statistics of the first ordered samples and the second ordered samples.

65. An article comprising: a memory having instructions stored thereon, in which when the instructions are executed by an operational processing block, they result in:

determining whether a fidelity criterion is met regarding a first version of a tag code decoded from a first wave received from an RFID tag; and
if so, outputting the first version of the code, else if not, deriving from the first version a final version of the code that is different from the first version, and outputting the final version instead of the first version.

66. The article of claim 65, in which
the fidelity criterion is met regarding the final version.

67. The article of claim 65, in which
the first version includes sampled data values that span a range, and
the fidelity criterion is met if none of the sampled data values is within a suspect window of the range.

68. The article of claim 65, in which
the first version includes first ordered samples at least one of which is suspect,
a first trial version is generated from most of the first ordered samples, but with changing the suspect sample, and
the first trial version becomes the final version if the fidelity criterion is met regarding the first trial version.

69. The article of claim 68, in which
the samples are logical bits.

70. The article of claim 68, in which
a second trial version is generated that is different from the first trial version and from the first received version, if the fidelity criterion is met regarding the first trial version, and
the second trial version becomes the final version if the fidelity criterion is met regarding the second trial version.

71. The article of claim 68, in which
the samples correspond to respective sampled data values that span a range, and
the suspect sample is identified as being the one whose sampled data value is closest to a decision threshold of the range.

72. The article of claim 71, in which
the range is between a minimum and a maximum, and
the decision threshold is derived as a statistic of the minimum and the maximum.

73. The article of claim 71, in which
the decision threshold becomes adjusted later responsive to the sampled data values.

74. The article of claim 65, in which
the final version is derived and outputted without decoding another version of the code.

75. The article of claim 65, in which
the final version is derived also from a second version of the tag code decoded from a second wave received from the RFID tag.

76. The article of claim 75, in which
the first version includes first ordered samples,
the second version includes second ordered samples that correspond to the first ordered samples, and
the final version is derived from the first and second samples that are similar, and by arbitrating between the first and the second samples that are different.

77. The article of claim 76, in which
the first and second samples are logical bits.

78. The article of claim 76, in which
arbitrating is performed by
generating a trial version from at least one the first version and the second version, and
determining whether the fidelity criterion is met for the trial version.

79. The article of claim 75, in which
the first version includes first ordered samples,
the second version includes second ordered samples that correspond to the first ordered samples, and
the final version includes final ordered samples that correspond to and are derived from statistics of the first ordered samples and the second ordered samples.

* * * * *